US009935140B2

(12) United States Patent
Isobe et al.

(10) Patent No.: US 9,935,140 B2
(45) Date of Patent: Apr. 3, 2018

(54) SOLID STATE IMAGING DEVICE, MANUFACTURING METHOD OF SOLID STATE IMAGING DEVICE, AND IMAGING SYSTEM

(71) Applicant: CANON KABUSHIKI KAISHA, Tokyo (JP)

(72) Inventors: Mari Isobe, Kawasaki (JP); Shunsuke Nakatsuka, Sagamihara (JP); Masatsugu Itahashi, Yokohama (JP); Yasuhiro Sekine, Yokohama (JP); Sho Suzuki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 43 days.

(21) Appl. No.: 15/152,982

(22) Filed: May 12, 2016

(65) Prior Publication Data

US 2016/0343754 A1 Nov. 24, 2016

(30) Foreign Application Priority Data

May 19, 2015 (JP) .................................. 2015-101704
Apr. 15, 2016 (JP) .................................. 2016-081833

(51) Int. Cl.
| | | |
|---|---|---|
| H01L 27/148 | (2006.01) | |
| H01L 27/146 | (2006.01) | |
| H04N 5/378 | (2011.01) | |

(52) U.S. Cl.
CPC .. *H01L 27/14612* (2013.01); *H01L 27/14603* (2013.01); *H01L 27/14621* (2013.01); *H01L 27/14623* (2013.01); *H01L 27/14627* (2013.01); *H01L 27/14636* (2013.01); *H01L 27/14643* (2013.01); *H01L 27/14645* (2013.01); *H01L 27/14685* (2013.01); *H01L 27/14689* (2013.01); *H04N 5/378* (2013.01)

(58) Field of Classification Search
CPC ............. H01L 27/146; H01L 27/14612; H01L 27/14621
USPC ........................................... 257/228; 438/60
See application file for complete search history.

(56) References Cited

U.S. PATENT DOCUMENTS

| 8,551,801 B2 | 10/2013 | Hashimoto et al. |
| 8,730,361 B2 | 5/2014 | Itahashi |
| 8,981,439 B2 | 3/2015 | Hashimoto |

(Continued)

FOREIGN PATENT DOCUMENTS

JP 2012-248681 A 12/2012

OTHER PUBLICATIONS

Extended European Search Report in European Application No. 16170126.3 (dated Oct. 5, 2016).

*Primary Examiner* — Jami M Valentine
(74) *Attorney, Agent, or Firm* — Fitzpatrick, Cella, Harper & Scinto

(57) ABSTRACT

A manufacturing method of a solid state imaging device according to one embodiment includes the steps of forming, on a substrate, a gate electrode of a first transistor and a gate electrode of a second transistor adjacent to the first transistor; forming an insulator film covering the gate electrode of the first transistor and the gate electrode of the second transistor such that a void is formed between the gate electrode of the first transistor and the gate electrode of the second transistor; forming a film on the insulator film; and forming a light shielding member by removing a part of the film by an etching.

19 Claims, 12 Drawing Sheets

(56) References Cited

U.S. PATENT DOCUMENTS

| | | | |
|---|---|---|---|
| 9,018,722 B2 | 4/2015 | Hashimoto et al. | |
| 9,202,842 B2 | 12/2015 | Itahashi et al. | |
| 9,236,410 B2 | 1/2016 | Kato et al. | |
| 9,461,265 B2 * | 10/2016 | Moriwaki | G02F 1/136227 |
| 2004/0051124 A1 | 3/2004 | Kawasaki | |
| 2012/0033119 A1 * | 2/2012 | Shinohara | H01L 27/14623 |
| | | | 348/302 |
| 2012/0299066 A1 | 11/2012 | Kato et al. | |
| 2014/0091378 A1 | 4/2014 | Hashimoto | |
| 2015/0325620 A1 | 11/2015 | Itahashi et al. | |
| 2015/0364517 A1 | 12/2015 | Onuki et al. | |
| 2015/0364522 A1 | 12/2015 | Itahashi et al. | |

\* cited by examiner

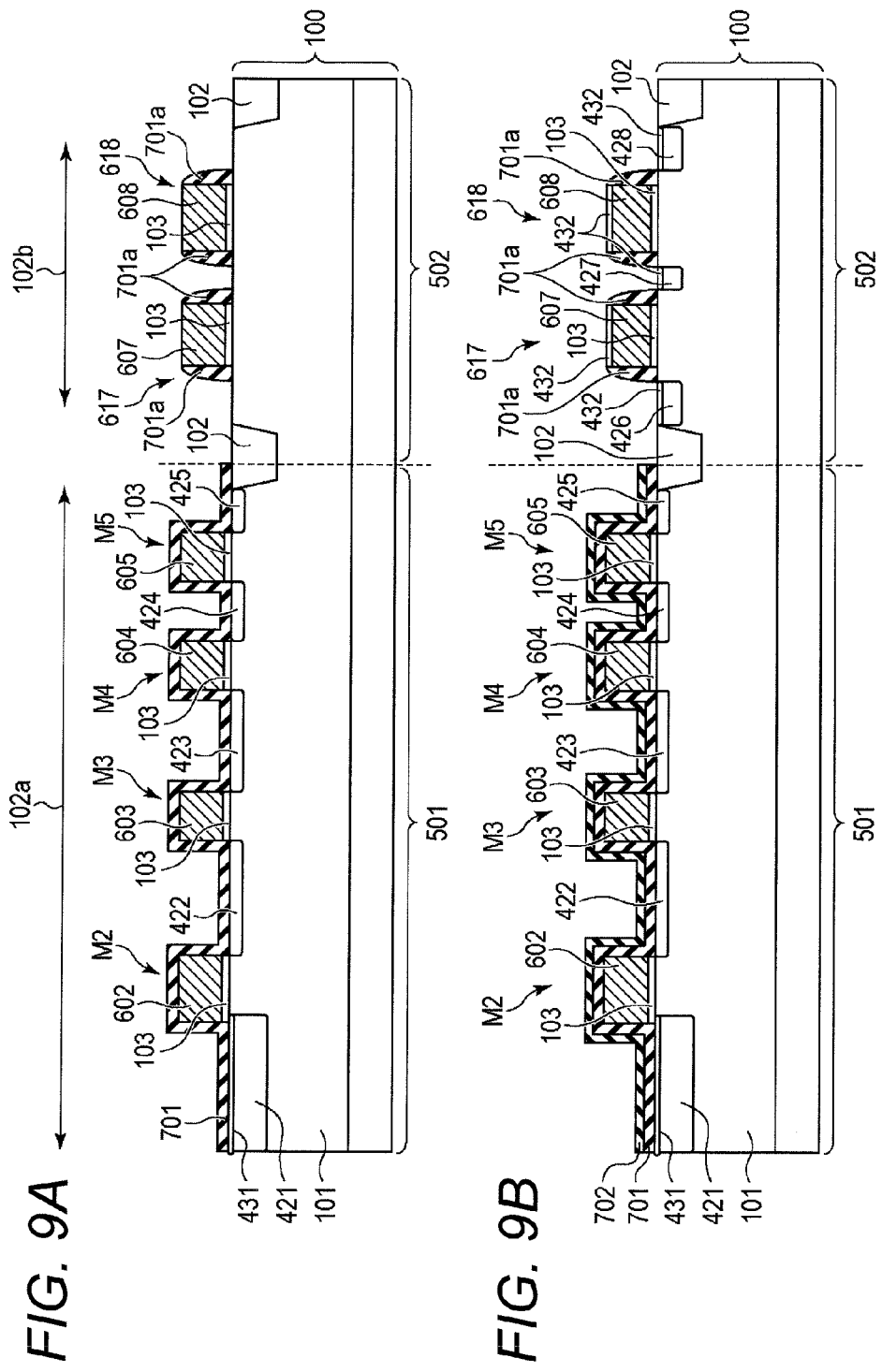

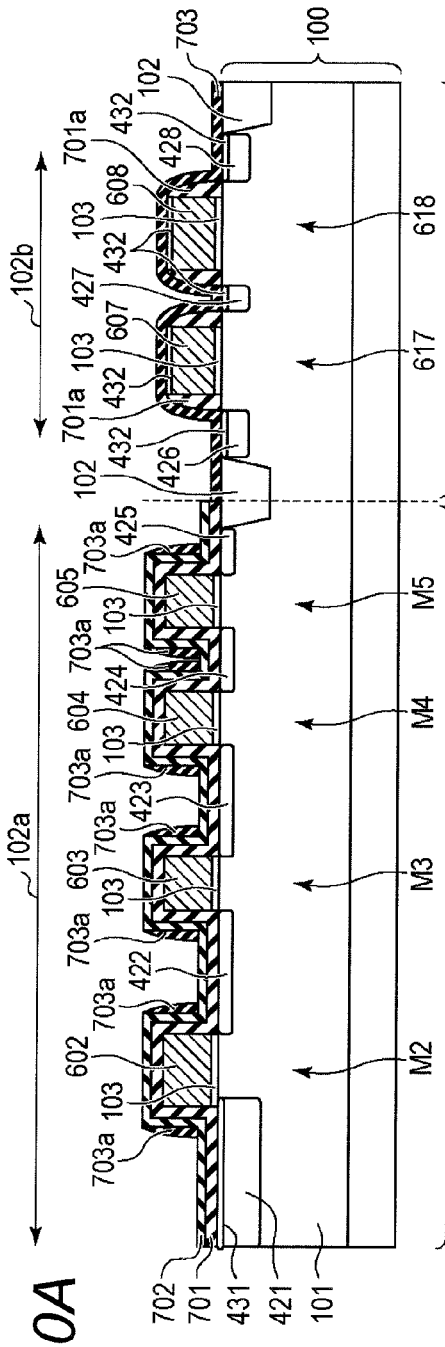
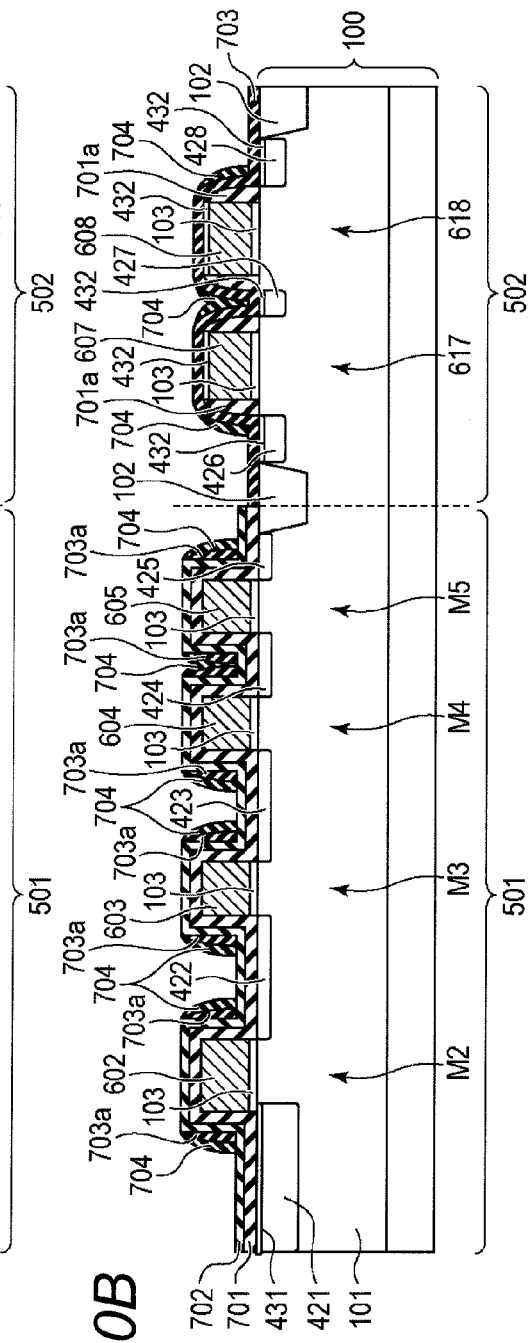
FIG. 10A
FIG. 10B

SOLID STATE IMAGING DEVICE, MANUFACTURING METHOD OF SOLID STATE IMAGING DEVICE, AND IMAGING SYSTEM

BACKGROUND OF THE INVENTION

Field of the Invention

The present invention relates to a solid state imaging device, a manufacturing method of a solid state imaging device, and an imaging system.

Description of the Related Art

In solid state imaging devices such as a CMOS image sensor, a CCD image sensor, and the like are provided with a light shielding member that prevents a light from entering portions other than a photoelectric conversion unit that performs a photoelectric conversion. For example, a CMOS image sensor having a global electronic shutter (all-pixel corrective simultaneous exposure) function has a charge holding unit that holds charges transferred from a photoelectric conversion unit. With a light entering the charge holding unit and causing a photoelectric conversion, the photoelectric-converted charges may be likely to cause noise resulting in degradation of an image quality. Therefore, the charge holding unit is covered with a light shielding member to prevent an incidence of a light. Further, in a CCD image sensor, similarly to the CMOS image sensor, a reading out unit is covered with a light shielding member, because an incidence of a light to the reading out unit may cause noise.

In a solid state imaging device having a light shielding member, since there is an optically transparent interlayer insulating film between a substrate and a light shielding member, it is intended to improve the light shielding property by preventing an incoming light through the interlayer insulating film. Japanese Patent Application Publication No. 2012-248681 discloses that the film thickness of an insulating layer is reduced by etching the insulating layer disposed under a light shielding member. A leakage of a light to a charge holding unit is suppressed by reducing the thickness of the insulating film under the light shielding member to reduce the distance between a photoelectric conversion unit and an under surface of a light shielding member in order to improve of the light shielding property.

When an insulating film is formed on neighboring gate electrodes and a light shielding film is deposited thereon, a certain size of a gap between gate electrodes is less likely cause a residue even when the light shielding film is etched, because there is a portion where the insulating film is sufficiently flat between the gate electrodes.

On the other hand, refinement in a semiconductor process results in a narrower gap between gate electrodes. After a light shielding film that becomes a light shielding member is deposited on this narrow gap and the light shielding member is etched, a residue of the light shielding film may remain inside the narrow gap. Such a residue may cause a leakage. In Japanese Patent Application Publication No. 2012-248681, an insulating film is deposited under a light shielding film to fill a recess between gate electrodes and between wirings and reduce a level difference. This can reduce occurrence of an etching residue of the light shielding film. In Japanese Patent Application Publication No. 2012-248681, however, while a recess narrower than a certain spacing can be filled, a recess wider than or equal to the certain spacing cannot be fully filled and a thin gap remains, and the light shielding member may remain in the gap. Even when the thickness of the insulating film to be filled is increased, a gap may occur depending on a spacing and thus occurrence of a residue cannot be completely prevented.

Further, when the flatness of an insulating film surface is degenerated due to a level difference around gate electrodes, the flatness of a light shielding member and a structure formed thereon is also degenerated, which may reduce a yield rate. One of the objects of the present invention is to provide a solid state imaging device, a manufacturing method of a solid state imaging device, and an imaging system that can maintain a light shielding property of a light shielding member and improve a yield rate.

SUMMARY OF THE INVENTION

A manufacturing method of a solid state imaging device according to one embodiment of the present invention has the steps of forming, on a substrate, a first gate electrode of a first transistor and a second gate electrode of a second transistor adjacent to the first transistor; forming an insulator film covering the first gate electrode and the second gate electrode such that a void is formed between the first gate electrode and the second gate electrode; forming a film on the insulator film; and forming a light shielding member by removing a part of the film by etching, the part being located over the void with the insulator film interposed between the film and the void.

In a manufacturing method of a solid state imaging device according to another embodiment of the present invention, a direction in which the first gate electrode, the insulator film, and the film that becomes the light shielding member are stacked on the substrate is defined as a first direction, and the insulator film is formed to satisfy the following equation: $a \times b \times d_1 \leq t$, where a represents a ratio of etching time of the insulator film to etching time of the film that becomes the light shielding member, b represents an etching selection ratio of the insulator film to the film that becomes the light shielding member, t represents a film thickness in the first direction of the insulator film, and $d_1$ represents a film thickness in the first direction of the light shielding member.

Further, a solid state imaging device according to another embodiment of the present invention includes a pixel circuit that has a first transistor having a first gate electrode, a second transistor having a second gate electrode adjacent to the first gate electrode in a plan view, an insulator film covering the first gate electrode and the second gate electrode, and a light shielding member provided on the insulator film, a void is present in a region surrounded by the first gate electrode, the second gate electrode, and the insulator film, and the light shielding member is absent in a position in the opposite side of the insulator film to the void in a direction perpendicular to the plan view.

Further features of the present invention will become apparent from the following description of exemplary embodiments with reference to the attached drawings.

BRIEF DESCRIPTION OF THE DRAWINGS

FIG. 9A and FIG. 9B are process sectional views illustrating a manufacturing method of the solid state imaging device according to the third embodiment of the present invention.

FIG. 10A and FIG. 10B are process sectional views illustrating a manufacturing method of the solid state imaging device according to the third embodiment of the present invention.

DESCRIPTION OF THE EMBODIMENTS

Preferred embodiments of the present invention will now be described in detail in accordance with the accompanying drawings.

In the specification, when a member A is described to be provided or formed over a member B, the member A is at least partially overlapped with the member B in the stack direction.

First Embodiment

Figure 1:
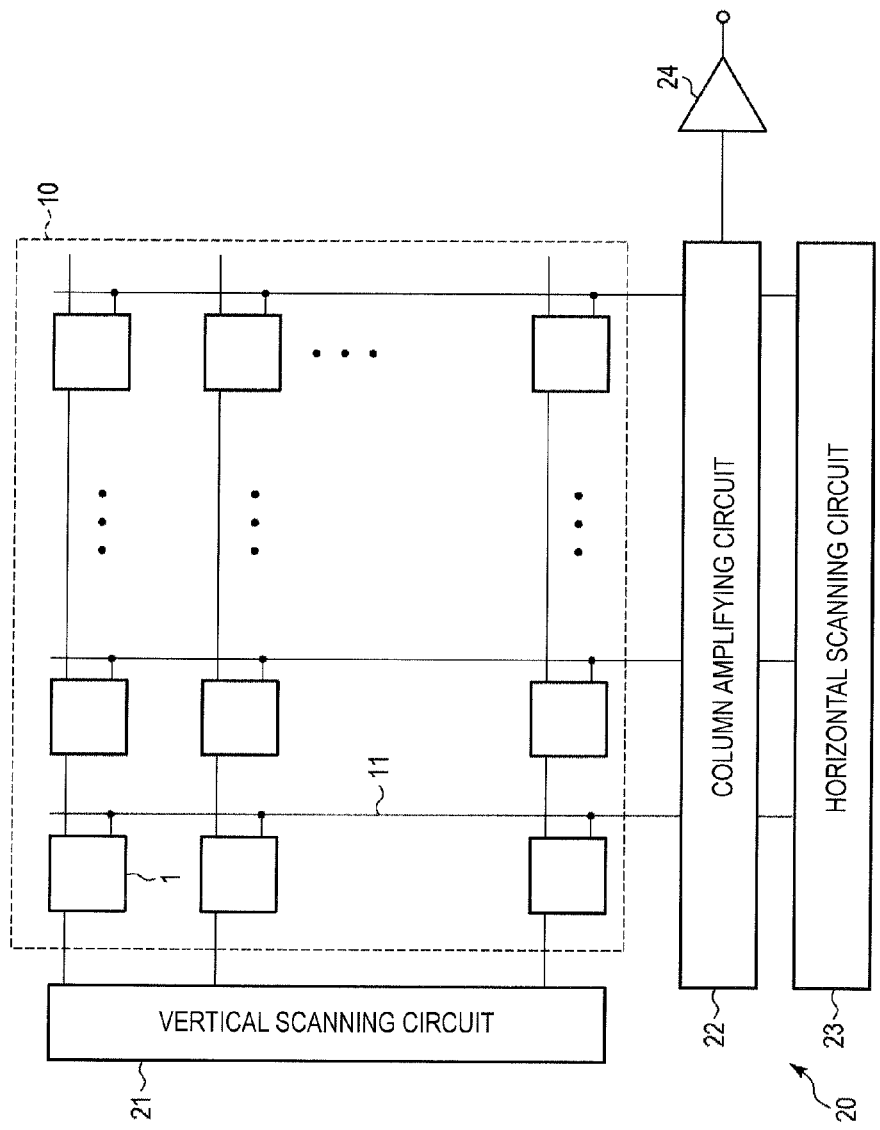
FIG. 1 is a block diagram of a solid state imaging device according to a first embodiment of the present invention.

A solid state imaging device and a manufacturing method thereof according to the first embodiment of the present invention will be described with reference to the drawings. FIG. 1 is a block diagram of a solid state imaging device according to the present embodiment. The solid state imaging device includes a pixel region 10 having a plurality of pixel circuits 1 aligned in a matrix and a peripheral region 20 that is located in the peripheral of the pixel region and in which peripheral circuits are arranged. The pixel circuit 1 includes a photoelectric conversion unit for performing photoelectric conversion and a reading out unit for reading out charges. The reading out unit includes a transfer transistor that transfers charges, a reset transistor that resets a charge-voltage conversion unit, an amplifier transistor that outputs a signal corresponding to a potential of the charge-voltage conversion unit, and a select transistor for selecting the amplifier transistor. Further, the reading out unit may include a charge holding unit that holds charges from the photoelectric conversion unit. In a circuit portion other than the photoelectric conversion unit, such as the charge holding unit, an incident light is shielded by a light shielding member. Further, in the pixel region 10, a color filter for controlling a spectral sensitivity characteristic and a micro lens for converging light are provided on the photoelectric conversion unit, and a light shielding member for preventing color mixture may be formed between respective photoelectric conversion units. Furthermore, the pixel region 10 may include a pixel other than effective pixels which does not output an image, such as an optical black pixel where the photoelectric conversion unit is shielded, a dummy pixel having no photoelectric conversion unit, or the like.

The peripheral region 20 includes a vertical scanning circuit 21, a column amplifying circuit 22, a horizontal scanning circuit 23, and an output unit 24. The vertical scanning circuit 21 supplies control signals for controlling the transistors of the pixel circuits 1 to be turned on (a conducting state) or off (a non-conducting state). Vertical signal lines 11 are each provided to each line of the pixel circuits 1 and read out signals from the pixel circuits 1 on a line basis. The column amplifying circuit 22 includes differential amplification circuits and sample-and-hold circuits and amplifies pixel signals output to the vertical signal lines 11. The horizontal scanning circuit 23 has switches connected to amplifiers on respective lines and supplies control signals for controlling the switches to be turned on or off. The output unit 24 is formed of a buffer amplifier, a differential amplifier, and the like and outputs pixel signals from the column amplifying circuit 22 to a signal processing unit outside the solid state imaging device. The output pixel signals are subjected to a process such as analog/digital conversion, a correction of input data, and the like by the signal processing unit. Note that the solid state imaging device may be a so-called digital sensor having a function of analog/digital conversion.

Figure 2:
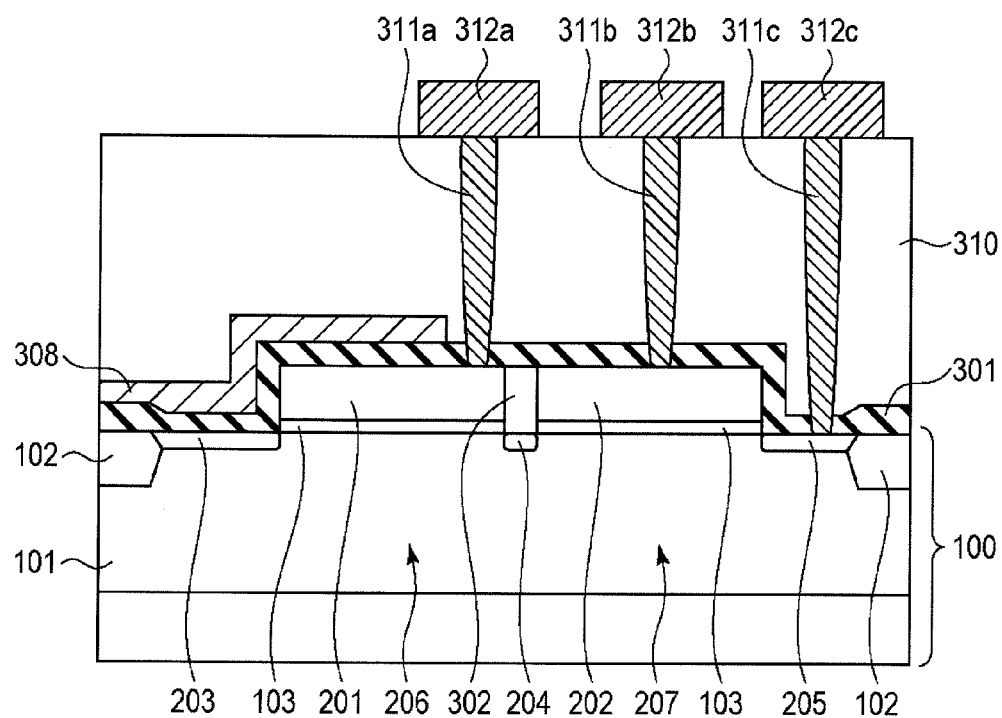
FIG. 2 is a schematic sectional view illustrating structure of the solid state imaging device according to the first embodiment of the present invention.

FIG. 2 is a schematic sectional view of a solid state imaging device according to the present embodiment. In this figure, a first transistor 206 and a second transistor 207 that are any two neighboring transistors are illustrated in a plan view. The transistors 206 and 207 are transistors forming the pixel circuit 1 as an example. Note that the two neighboring transistors 206 and 207 have a pair of gate electrodes 201 and 202 adjacent to each other, and there is a void 302 between the gate electrodes 201 and 202. Such transistors having a pair of gate electrodes interposing the void 302 may be any transistors in the pixel circuit 1 or in the peripheral circuit.

A semiconductor substrate 100 has a surface parallel to the X-Y plane including the X-axis direction and the Y-axis direction and is provided with a well 101 of a first conduction type (for example, P-type) having a predetermined thickness in the Z-axis direction (the first direction). Element isolation regions 102 that define an active region are provided on a surface of the semiconductor substrate 100 in which the well 101 has been formed. In the active region defined by the element isolation regions 102, impurity regions 203, 204, and 205 of a conduction type (for example, N-type) that is the opposite type of the well 101 are provided spaced apart from each other.

The gate electrode 201 is provided via a gate insulating film 103 on a semiconductor region (a channel region) between the impurity region 203 and the impurity region 204. Thereby, the transistor 206 having the impurity regions 203 and 204 forming source/drain regions and the gate electrode 201 is formed. As used herein, the source/drain region means a semiconductor region that can function as at least any one of a source and a drain of a transistor. Depending on a driving method of a transistor, the same semiconductor region may function as a source and may function as a drain, or the same semiconductor region may function as a source of one transistor and may function as a drain of another transistor. In a similar manner, the gate electrode 202 is provided via the gate insulating film 103 on a semiconductor region (a channel region) between the impurity region 204 and the impurity region 205. Thereby, the transistor 207 having the impurity regions 204 and 205 forming the source/drain regions and the gate electrode 202 is formed. These two transistors 206 and 207 share one of the source/drain regions (the impurity region 204). The gap between the gate electrodes 201 and 202 of the two transistors 206 and 207 is narrowed to around 1.0 μm or less, for example. Typically, the gap between the gate electrode 201 and the gate electrode 202 is less than a sum of the thickness of the gate electrode 201 and the thickness of the gate electrode 202, and less than or equal to 0.5 μm. The gap between the gate electrode 201 and the gate electrode 202 may be greater than or equal to 0.1 μm. Note that a thickness of a member or a film thickness as used herein refers to a length in the Z-axis direction (the first direction) perpendicular to a plan view of the semiconductor substrate 100. The direction in which layers of a gate electrode, an insulator film, a light shielding member, and the like described later are stacked on the semiconductor substrate 100 may be defined as the Z-axis direction. In the following description, unless otherwise specified, a thickness of a member and a film thickness refer to a length in the Z-axis direction.

An insulator film 301 is provided on the semiconductor substrate 100 in which the transistors 206 and 207 have been provided. The insulator film 301 is not fully filled in a gap between the gate electrode 201 and the gate electrode 202, and a void (a vacancy) 302 is formed in at least a part of a region between the gate electrode 201 and the gate electrode 202. By forming the void 302 in at least a part of a region between the gate electrode 201 and the gate electrode 202, the flatness (step coverage) of the surface of the insulator film 301 over this region can be improved. That is, the effect of a level difference (step) in the underlying layer, which is due to the gate electrode 201 and the gate electrode 202, is reduced at the surface portion of the insulator film 301 over the region (on and overlapped with the region in the z-direction) between the gate electrode 201 and the gate electrode 202. A light shielding member 308 made of a light shielding material such as tungsten, tungsten silicide, or the like is provided on a region of a part of the insulator film 301. By forming the void 302, the surface of the insulator film 301 can be flatten, and occurrence of a residue can be avoided when a light shielding film is etched on the insulator film 301 to form the light shielding member 308.

An interlayer insulating film 310 is disposed on the insulator film 301. Contact holes penetrating the interlayer insulating film 310 and the insulator film 301 are formed and contact plugs 311a to 311c are provided inside the contact holes. The contact plug 311a is connected to the gate electrode 201, and the contact plug 311b is connected to the gate electrode 202. Further, the contact plug 311c is connected to the source/drain region (the impurity region 205). The contact plugs 311a to 311c are connected to wirings 312a to 312c.

Figure 3A:
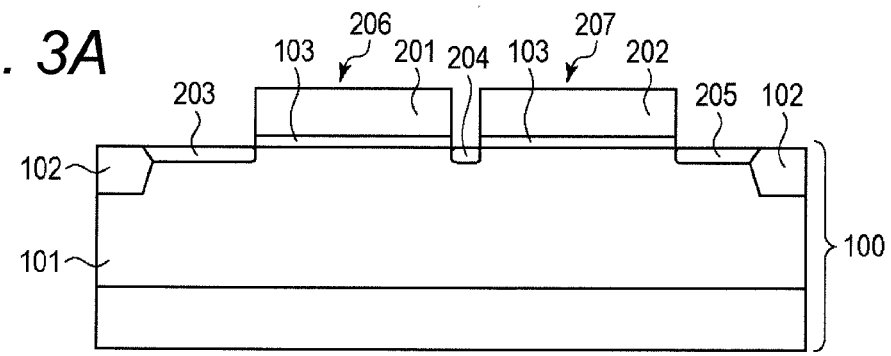
FIGS. 3A, 3B, 3C and 3D are process sectional views illustrating a manufacturing method of the solid state imaging device according to the first embodiment of the present invention.

FIG. 3A to FIG. 3D are process sectional views illustrating a manufacturing method of the solid state imaging device according to the first embodiment of the present invention. As illustrated in FIG. 3A, the element isolation regions 102 that define an active region are formed on the surface portion of the semiconductor substrate 100 by using the STI (Shallow Trench Isolation) technique, the LOCOS (LOCal Oxidation of Silicon) technique, or the like, for example. Subsequently, the well 101 is formed in a predetermined region of the semiconductor substrate 100 by using an ion implantation technique.

After the well 101 is formed, the gate insulating film 103 made of a silicon oxide film or the like, for example, is formed on the surface of the active region of the semiconductor substrate 100 by using a thermal oxidation technique, a CVD technique, or the like. For example, a polysilicon film is deposited by using a CVD technique, for example, on the entire surface of the semiconductor substrate 100 in which the gate insulating film 103 has been formed. This polysilicon film is patterned by using a photolithography and a dry etching to form the gate electrodes 201 and 202 made of the polysilicon film. Subsequently, an ion implantation is performed by using the gate electrodes 201 and 202 as a mask, and the impurity regions 203, 204, and 205 that become the source/drain regions are formed inside the semiconductor substrate 100 in a self-aligning manner with respect to the gate electrodes 201 and 202.

In such a way, the transistor 206 having the impurity regions 203 and 204 and the gate electrode 201 and the transistor 207 having impurity regions 204 and 205 and the gate electrode 202 are formed in the active region of the semiconductor substrate 100.

Figure 3B:
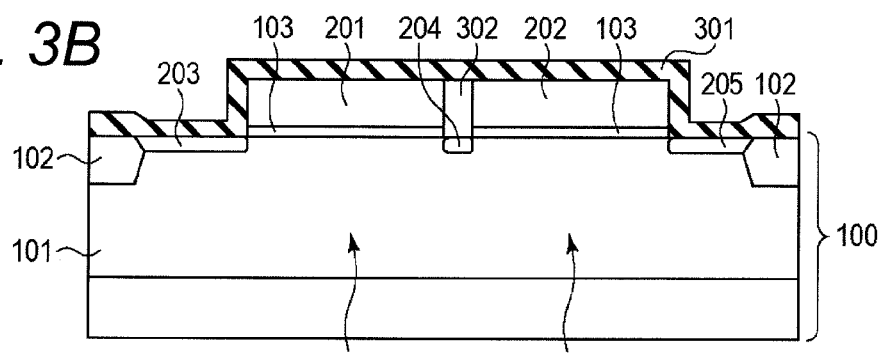

Next, as illustrated in FIG. 3B, the insulator film 301 such as a silicon oxide film, for example, is deposited on the semiconductor substrate 100 in which the transistors 206 and 207 have been formed. In this process, the insulator film 301 is formed such that the insulator film 301 is not fully filled in the gap between the gate electrode 201 and the gate electrode 202. Thereby, the void 302 is formed in at least a part of a region between the gate electrode 201 and the gate electrode 202. Here, the void 302 is present in a region surrounded by the gate electrode 201, the gate electrode 202, and the insulator film 301. Typically, in a deposition condition of an insulating film, the more the isotropic components are or the faster the forming rate is, the more a void is likely to remain in a narrow gap. With a consideration in this regard, it is possible to form the insulator film 301 while leaving the void 302 by properly setting deposition conditions of the insulator film 301 depending on a gap and/or a film thickness of the gate electrodes 201 and 202.

As a specific deposition condition, it is preferable to perform deposition by using a CVD technique having small anisotropy and/or fluidity such as a parallel plate plasma CVD technique in which a TEOS-$O_2$ based gas type and/or a $SiH_4$—$O_2$ based gas type is used. This is because, while an increased deposition rate allows the void 302, which is an air gap, to be more likely to be formed among the gate electrode 201, the gate electrode 202, and the insulator film 301, a gap that is sufficiently narrower than the void 302 is closed and a recess in a film over the void can be reduced.

In the present embodiment, the gas flow rates were TEOS: 265 sccm and $O_2$: 2.5 sccm, and the pressure was 360 Pa. Further, the RF outputs were 720 W at an upper electrode and 320 W at a lower electrode, the deposition time was 4 seconds, and a plasma CVD oxide film around 500 angstroms was deposited.

When the insulator film 301 is formed on a pattern arranged with a narrow gap such as between the gate electrodes 201 and 202 so as to fill the gap, a fine recess is formed on the surface portion (the face opposite to the face which is in contact with the gate electrodes 201 and 202) of the insulator film 301 between the gate electrode 201 and the gate electrode 202. If deposited in this fine recess in the subsequent process, a film may not be fully removed by a subsequent etching and may remain as a residue. In particular, when this film is a conductive film, this residue may cause a short circuit between wirings and cause deficiency. By forming the insulator film 301 so as to leave the void 302 between the gate electrodes 201 and 202, a recess on the region between the gate electrodes 201 and 202 can be reduced compared to the case of forming the insulator film 301 so as to fill the region between the gate electrodes 201 and 202.

Figure 3C:
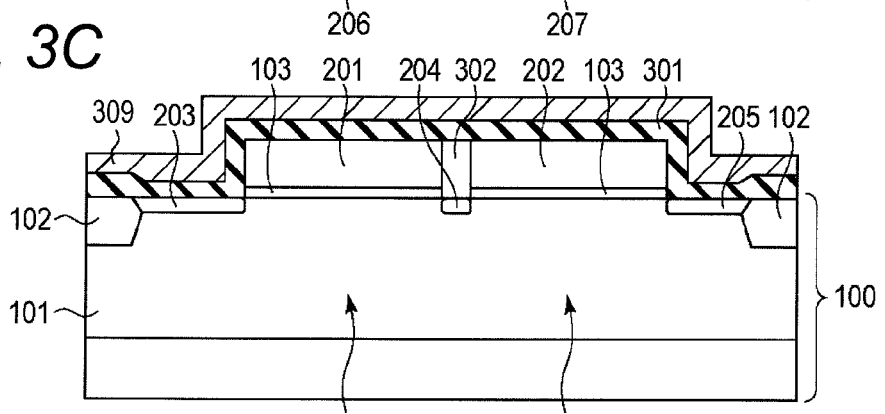
Figure 3D:
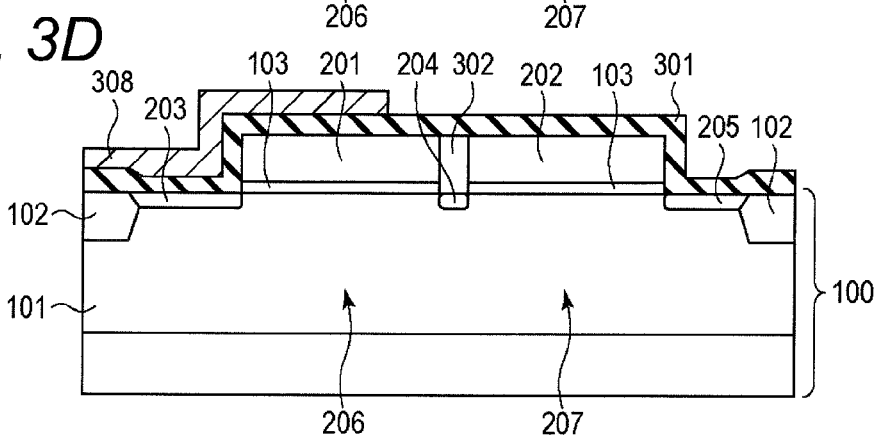

Next, as illustrated in FIG. 3C, a light shielding film 309 made of tungsten, tungsten silicide, or the like, for example, is formed on the insulator film 301 by using a spattering technique, a CVD technique, or the like. Furthermore, after the light shielding film 309 is formed, the light shielding film 309 is patterned into a predetermined shape by using a photolithography and a dry etching. In this way, the light shielding member 308 is formed from the light shielding film 309 as illustrated in FIG. 3D. In this patterning, a portion of the light shielding film 309 which is located over the photoelectric conversion unit may be removed. Further, a portion of the light shielding film 309 which is located over a contact part formed later may be removed. In this example, a portion of the light shielding film 309 which is located over the impurity region 204 between the gate electrodes 201 and 202, that is, a portion which is located over the void 302 is removed. In this process, a recess on which a residue of the light shielding film 309 would otherwise remain is not formed on the surface of the insulator film 301. That is, the flatness of the surface of the insulator film 301 over the region between the gate electrodes 201 and 202 can be improved and an etching residue of the light shielding film 309 can be avoided. Further, even when it is not necessary to remove the light shielding film 309 over the impurity region 204 between the gate electrodes 201 and 202, the improvement of the flatness of the surface of the insulator film 301 allows for an advantage of improving the flatness of the light shielding member 308.

Further, the present embodiment allows for an advantage of a reduced film thickness of the insulator film 301. As another solution for reducing a level difference on the surface of the insulator film 301, there may be an option of increasing the film thickness of the insulator film 301. However, an increased film thickness of the insulator film 301 results in an increased distance between the light shielding member 308 and the semiconductor substrate 100 and thus the light shielding property decreases. On the other hand, according to the present embodiment, the film thickness of the insulator film can be reduced without causing a level difference on the surface of the insulator film 301. For example, the film thickness of the insulator film 301 can be less than the thickness of the gate electrodes 201 and 202. Therefore, the distance between the light shielding member 308 and the semiconductor substrate 100 can be reduced to improve the light shielding property.

Note that, in terms of the light shielding property, it is desirable that the height of the under surface of the light shielding member 308 which is not formed on the gate electrode 201 be lower than the height of the upper surface of the gate electrodes 201 and 202. That is, it is desirable that the film thickness of the insulator film 301 be less than a sum of the film thickness of the gate insulating film 103 and the film thickness of the gate electrodes 201 and 202. Typically, since the film thickness of the gate insulating film 103 is less than the film thickness of the gate electrodes 201 and 202, it is sufficient to reduce the film thickness of the insulator film 301 to be less than the film thickness of the gate electrodes 201 and 202.

Subsequently, as illustrated in FIG. 2, the interlayer insulating film 310 that covers the light shielding member 308 and the gate electrodes 201 and 202 of the plurality of transistors is formed. A flattening process is applied on the interlayer insulating film 310 by using an etching-back technique, a CMP technique, a reflow technique, or the like.

Contact holes that penetrate the interlayer insulating film 310 and the insulator film 301 to reach the semiconductor substrate 100, the gate electrodes 201 and 202, or the light shielding member 308 are then formed. The contact plugs 311a to 311c are formed by filling a conductive material, such as tungsten, inside the contact holes. These contact plugs 311a to 311c penetrate the interlayer insulating film 310 and the insulator film 301 to be connected to any one of the plurality of transistors 206 and 207. On the other hand, no contact plug is formed over the impurity region 204, that is, over the void 302. If a contact hole were provided so as to penetrate the void 302, there would be a case of a conductive material entering the inside of the void 302 at forming of a contact plug. With no contact hole provided over the void 302, however, such a case can be avoided. When it is necessary to connect a contact plug to the impurity region 204, it is preferable to form a contact plug at a position spaced apart from the void 302. Since the light shielding film 309 is removed from a portion through which contact plugs 311a to 311c pass, the contact plugs 311a to 311c are formed spaced apart from the light shielding member 308. A contact plug (not illustrated) connected to the light shielding member 308 may be further formed. Furthermore, the wirings 312a to 312c connected to respective contact plugs 311a to 311c are formed on the interlayer insulating film 310.

The insulator film 301 functions also as an etching stopper film when the light shielding member 308 is etched. When the film thickness of the insulator film 301 is less than a thickness of the insulator film 301 which is etched by an over-etching at an etching of the light shielding member, the surface of the semiconductor substrate 100 is exposed at the etching of the light shielding member 308, which results in etching damage on the semiconductor substrate 100. This etching damage causes a dark current and the like.

Here, in the Z-axis direction (the first direction) in which the gate electrode 201 of the first transistor 206, the insulator film 301, and the light shielding member 308 are laminated, the film thickness of the insulator film 301 is denoted as t and the film thickness of the light shielding member 308 is denoted as $d_1$. Further, the ratio of over-etching time to main etching time at an etching of the light shielding member is denoted as a, and the selection ratio of the insulator film 301 to the light shielding member 308 at the etching of the light shielding member is denoted as b. In this case, the thickness of the insulator film 301 etched at the etching of the light shielding member is $a \times b \times d_1$. Therefore, the film thickness t of the insulator film 301 is preferably greater than or equal to $a \times b \times d_1$.

Further, contacting of the light shielding member 308 with the wirings 312a to 312c causes a leakage or the like. In the Z-axis direction, the film thickness t of the insulator film 301 is preferably less than $d_3-(d_1+d_2+d_4)$, where $d_2$ represents the film thickness of the gate electrodes 201 and 202, $d_3$ represents the least distance of the distances from the wirings 312a to 312c to the semiconductor substrate 100, and $d_4$ represents the thickness of the gate insulating film 103.

In terms of the light shielding property, since a greater film thickness of the insulator film 301 results in a greater distance between the light shielding member 308 and the semiconductor substrate 100 and a reduced light shielding property, a smaller film thickness t of the insulator film 301 allows for a better light shielding property.

A specific example will be described below. When tungsten is used for the light shielding member 308, the film thickness $d_1$ is preferably greater than or equal to 0.1 μm to obtain a sufficient light shielding capability. The transmittance of tungsten is 0.2% or less at a thickness of 0.1 µm or greater and thus realizes a sufficient light shielding capability.

When the ratio a of over-etching time to main etching time at an etching of the light shielding member is 0.1 and the selection ratio b of the insulator film 301 to the light shielding member 308 is 0.1, the film thickness t of the insulator film 301 is required to be at least 1.0 nm or greater. Since it is necessary to take manufacturing variation into consideration in the actual practice, the insulator film thickness is preferably greater than or equal to 5.0 nm.

Further, when the film thickness $d_1$ of the light shielding member 308 is 0.1 µm, the film thickness $d_2$ of the gate electrodes is 0.2 µm, the distance $d_3$ from the wirings 312a to 312c to the semiconductor substrate 100 is 0.6 µm, and the film thickness $d_4$ of the gate insulating film is 8.0 nm, the film thickness t of the insulator film 301 is preferably less than at least 0.3 µm to avoid contacting with the wirings. Since manufacturing variation of the interlayer insulating film, the light shielding member, or the like occurs in the actual practice and a greater film thickness t of the insulating film 301 results in a lower light shielding property, the film thickness t of the insulator film 301 is preferably less than or equal to 0.1 µm.

Therefore, the film thickness of the insulator film 301 is preferably greater than or equal to 1 nm and less than 0.3 µm, and more preferably greater than 5 nm and less than 0.1 µm.

As described above, according to the present embodiment, a recess on a surface of an insulator film formed between gate electrodes can be reduced, and the flatness of an underlying layer of a structure formed on such a region can be improved. In particular, in the case where a conductive film formed over a region between gate electrodes is removed by an etching, this removal can suppress a residue of the conductive film left on a recess of an insulator film and thus improve a yield ratio.

Second Embodiment

Figure 4:
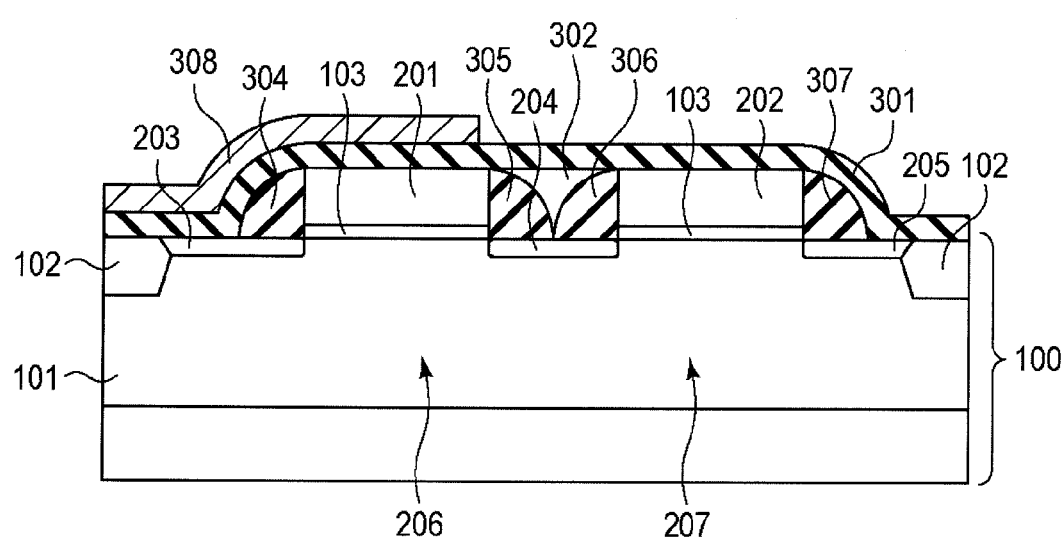
FIG. 4 is a schematic sectional view illustrating structure of a solid state imaging device according to a second embodiment of the present invention.
Figure 5A:
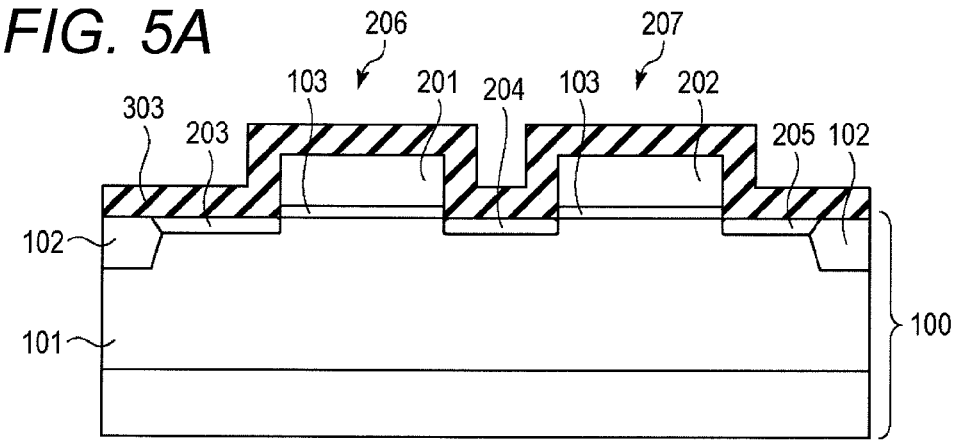
FIGS. 5A, 5B and 5C are process sectional views illustrating a manufacturing method of the solid state imaging device according to the second embodiment of the present invention.
Figure 5B:
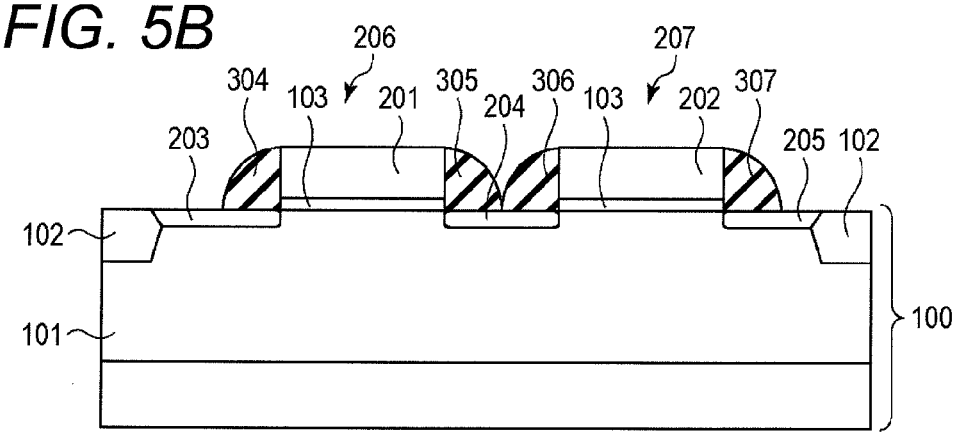
Figure 5C:
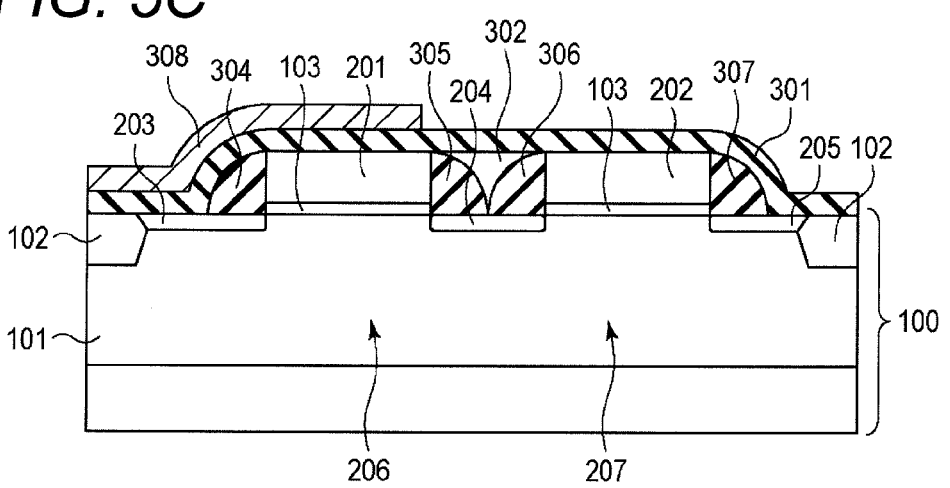

A solid state imaging device and a manufacturing method according to the second embodiment of the present invention will be described by using FIG. 4 and FIG. 5A to FIG. 5C. FIG. 4 is a schematic sectional view illustrating the structure of a solid state imaging device according to the present embodiment, and FIG. 5A to FIG. 5C are process sectional views illustrating a manufacturing method of the solid state imaging device according to the present embodiment. The same reference numerals are provided to components similar to those of the solid state imaging device according to the first embodiment illustrated in FIG. to FIG. 3, and description thereof will be omitted or briefly summarized.

As illustrated in FIG. 4, the solid state imaging device of the present embodiment is substantially the same as the solid state imaging device of the first embodiment illustrated in FIG. 2 except that sidewall spacers 304, 305, 306, and 307 are formed on the side surfaces of the gate electrodes 201 and 202. Since the sidewall spacers 305 and 306 are formed on facing side surfaces of the gate electrodes 201 and 202, the void 302 is formed between the sidewall spacers 305 and 306. Also in the present embodiment, the void 302 is formed without the insulator film 301 being filled in the gap between the gate electrodes 201 and 202, and thereby the flatness of the surface of the insulator film 301 over the void 302 can be improved.

Next, a manufacturing method of the solid state imaging device according to the present embodiment will be described by using FIG. 5A to FIG. 5C. In FIG. 5A, in a similar manner to the manufacturing method of the solid state imaging device of the first embodiment, the well 101, the element isolation regions 102, the first transistor 206, and the second transistor 207 are formed in the semiconductor substrate 100. A dielectric film 303 made of a silicon oxide film, for example, is formed on the entire surface by using a CVD technique or the like. Subsequently, as illustrated in FIG. 5B, the dielectric film 303 is etched back to form the sidewall spacers 304, 305, 306, and 307 on the side surfaces of the gate electrodes 201 and 202. Note that the dielectric film and the insulator film are different only in their names for the purposes of illustration, and the material forming the dielectric film and the material forming the insulator film may be the same.

Next, as illustrated in FIG. 5C, the insulating film 301 such as a silicon oxide film, for example, is deposited by using a plasma CVD technique or the like on the semiconductor substrate 100 on which the sidewall spacers 304, 305, 306, and 307 have been formed. At this time, the insulator film 301 is deposited so that the insulator film 301 is not filled in a gap between the sidewall spacers 305 and 306 between the gate electrodes 201 and 202. Thereby, the void 302 is left in at least a part of a region between the gate electrode 201 and the gate electrode 202. A recess formed over the region between the gate electrodes 201 and 202 can be reduced by forming the insulator film 301 so as to form the void 302 between the gate electrodes 201 and 202.

Subsequently, a light shielding film made of tungsten, tungsten silicide, or the like is formed on the insulator film 301 by a spattering technique, a CVD technique, or the like. Furthermore, the light shielding member 308 is formed by patterning the light shielding film into a predetermined shape by using a photolithography and a dry etching. A portion of the light shielding film which is located over the impurity region 204 between the gate electrodes 201 and 202 is removed. In this process, since no recess occurs on the surface of the insulator film 301 present over the region between the gate electrodes 201 and 202, the etching residue of the light shielding film can be suppressed.

Further, the sidewall spacers 304, 305, 306, and 307 are formed on the side surfaces of the gate electrodes 201 and 202, and thereby gradual slopes are provided at level differences of the gate electrodes 201 and 202. This improves a coating property of the light shielding member 308 on the level difference portions, in particular, on the sidewall spacer 304, and thus can improve the light shielding property. Furthermore, in a similar manner to the first embodiment, the film thickness of the insulator film 301 can be reduced to be less than a sum of the film thickness of the gate electrodes 201 and 202 and the film thickness of the gate insulating film 103, and the distance between the light shielding member 308 and the semiconductor substrate 100 can be reduced. This allows a better light-shielding property to be obtained.

Similarly to the first embodiment, since the insulator film 301 also serves as an etching stopper film at an etching of the light shielding member, the thickness of the insulator film 301 is preferably greater than the film thickness of the insulator film etched at the etching of the light shielding member. Note that, in the Z-axis direction (the first direction) in which the gate electrode 201 of the first transistor 206, the insulator film 301, and the light shielding member 308 are laminated, the film thickness of the insulator film 301 is denoted as t and the film thickness of the light shielding member 308 is denoted as $d_1$. Further, the ratio of over-etching time to main etching time at an etching of the light shielding member is denoted as a, and the selection ratio of the insulator film 301 to the light shielding member 308 at the etching of the light shielding member is denoted as b. In this case, since the thickness of the insulator film 301 etched at the etching of the light shielding member is $a \times b \times d_1$, t is preferably greater than or equal to $a \times b \times d_1$.

Further, contacting of the light shielding member 308 with wirings causes a leakage or the like. In the Z-axis direction, the film thickness t of the insulator film 301 is preferably less than $d_3-(d_1+d_2+d_4)$, where $d_2$ represents the film thickness of the gate electrodes 201 and 202, $d_3$ represents the least distance of the distances from the wirings 312a to 312c to the semiconductor substrate 100, and $d_4$ represents the thickness of the gate insulating film 103.

Note that the same film formation method as in the first embodiment can be used for the film formation method for the insulator film 301.

As described above, according to the present embodiment, a recess on a surface of an insulator film formed between gate electrodes can be reduced, which can improve the flatness of an underlying layer of a structure formed on such a region. In particular, in the case where a conductive film formed over a region between gate electrodes is removed by an etching, such removal can suppress a residue of the conductive film left on a recess of an insulator film and thus improve a yield ratio. Further, the light shielding property can be improved by forming sidewall spacers on the side surfaces of the gate electrodes.

Third Embodiment

Figure 6:
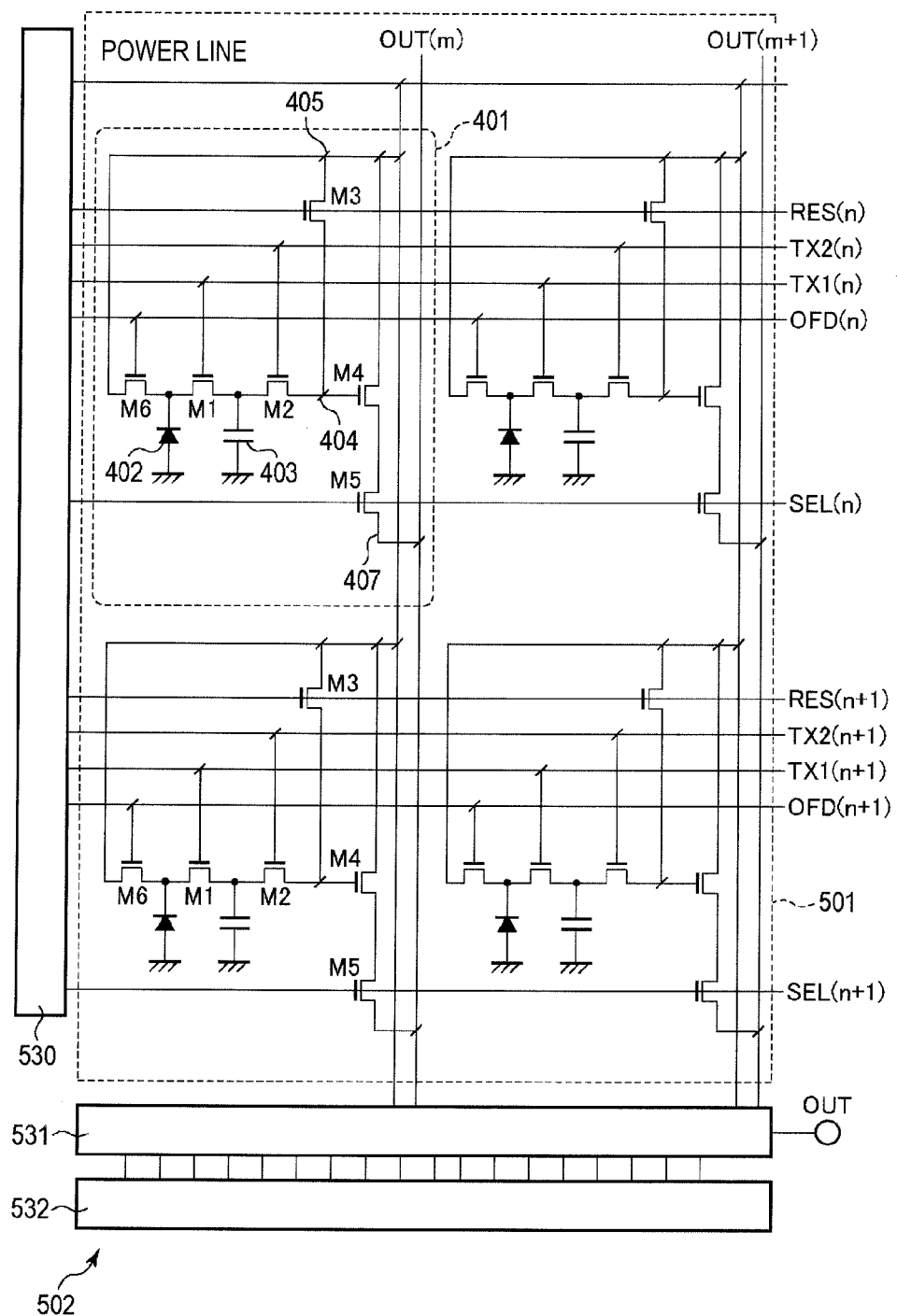
FIG. 6 is a block diagram of a solid state imaging device according to a third embodiment of the present invention.

A solid state imaging device and a manufacturing method thereof according to the third embodiment of the present invention will be described by using FIG. 6 to FIG. 11. FIG. 6 is a block diagram of the solid state imaging device of the present embodiment. The solid state imaging device has a pixel region 501 including peripheral circuits such as a plurality of pixel circuits 401 and a peripheral region 502 including a vertical scanning circuit 530, a column amplifying circuit 531, and a horizontal scanning circuit 532. Although FIG. 6 depicts the pixel circuit 401 with two rows by two lines in the pixel region 501, the number of pixels is not limited. The pixel circuit 401 includes a photoelectric conversion unit 402, a charge holding unit 403, a charge-voltage conversion unit 404, a power source unit 405, a pixel output unit 407, first and second transfer transistors M1 and M2, a reset transistor M3, an amplifier transistor M4, a selection transistor M5, and an overflow drain (hereafter, referred to as "OFD") transistor M6. The photoelectric conversion unit 402 is formed of a micro lens, a photodiodes, and the like and accumulates charges based on an incident light. The photoelectric conversion unit 402 is electrically connected to the OFD transistor M6 and the first transfer transistor M1. The transistor M6 discharges charges of the photoelectric conversion unit 402 to the power source unit 405 in response to a control signal OFD(n) supplied to the gate electrode.

The first transfer transistor M1 transfers charges from the photoelectric conversion unit 402 to the charge holding unit 403 in response to a control signal TX1(n) supplied to the gate electrode. The charge holding unit 403 holds charges transferred via the transfer transistor M1. The second transfer transistor M2 transfers charges held by the charge holding unit 403 to the charge-voltage conversion unit 404 in response to a control signal TX2(n). The reset transistor M3 resets a voltage of the charge-voltage conversion unit 404 to a voltage of the power source unit 405 in response to a control signal RES(n). The amplifier transistor M4 outputs a signal corresponding to a potential of the gate electrode to a signal line OUT(m). The selection transistor M5 is electrically connected between the power source unit 405 and the amplifier transistor M4 and supplies a current to the amplifier transistor M4 in response to a signal SEL(n).

The power source unit 405 is on the same node as the drain of the reset transistor M3, the drain of the selection transistor M5, and the drain of the OFD. The vertical scanning circuit 530 supplies the control signals RES(n), TX1(n), TX2(n), SEL(n), and OFD(n) to a unit pixel circuit. A signal output from the signal line OUT is held in the column amplifying circuit 531 and subjected to operations such as amplification, addition, and the like. The horizontal scanning circuit 532 causes signals held by the column amplifying circuit 531 to be sequentially output to output terminals OUTs.

Operation of a global shutter in the solid state imaging device according to the present embodiment will be described. After a certain accumulation period has elapsed, charges generated at the photoelectric conversion unit 402 are transferred to the charge holding unit 403 via the transfer transistor M1. While the charge holding unit 403 is holding signal charges, accumulation of charges restarts at the photoelectric conversion unit 402. Charges in the charge holding unit 403 are transferred to the charge-voltage conversion unit 404 via the second transistor M2, and is output as a signal from the pixel output unit 407 that is one terminal of the amplifier transistor M4. Further, the OFD transistor M6 may discharge charges of the photoelectric conversion unit 402 so that charges generated at the photoelectric conversion unit 402 are not mixed to the charge holding unit 403 while the charge holding unit 403 is holding signal charges. The reset transistor M3 sets the charge-voltage conversion unit 404 to a predetermined potential before the signal charges are transferred from the charge holding unit 403 (a reset operation). The potential of the charge-voltage conversion unit 404 at this time is output as a noise signal from the pixel output unit 407 to the column amplifying circuit 531. Subsequently, the reset transistor M3 is turned off, and a signal based on a photoelectric conversion is output to the column amplifying circuit 531. The column amplifying circuit 531 generates a signal in which the noise signal is removed by outputting a differential signal of the noise signal and the signal based on the photoelectric conversion.

Figure 7:
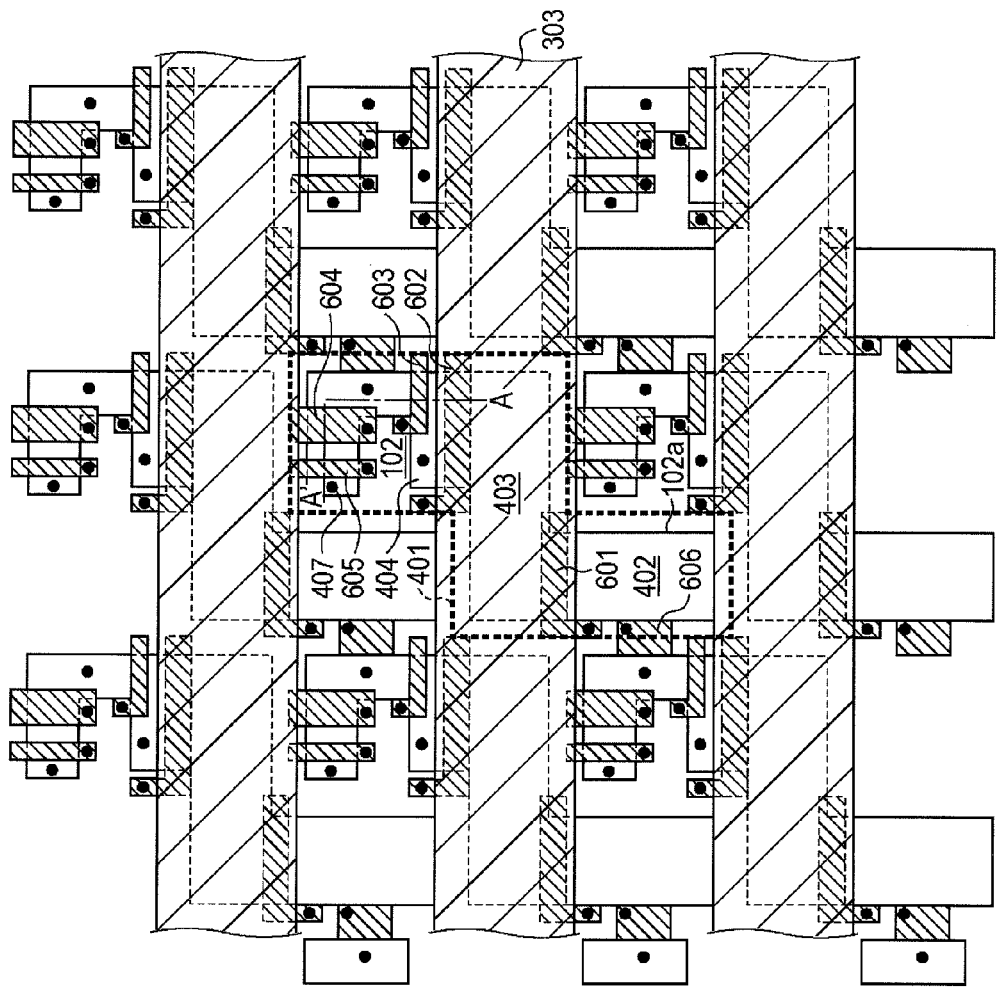
FIG. 7 is a plan view illustrating structure of the solid state imaging device according to the third embodiment of the present invention.

FIG. 7 is a plan view of the pixel region 501 of the solid state imaging device according to the present embodiment when viewed from the Z-axis direction. Although FIG. 7 depicts the pixel circuit 401 with three rows by three lines forming the pixel region 501, the number of pixels is not limited thereto as described above. In each pixel circuit 401, an active region 102a shaped in substantially a mirrored figure S is defined by the element isolation regions 102. Gate electrodes 601 to 606 of the transistors M1 to M6 forming a pixel circuit are arranged on the active region 102a. That is, a plurality of gate electrodes 601, 602, 603, 604, and 605 are arranged in this order from the lower side of the active region 102a in FIG. 7 so as to be across the active region 102a. In this case, the gate electrode 601 is the gate electrode of the first transfer transistor M1, and the gate electrode 602 is the gate electrode of the second transfer transistor M2. The gate electrode 603 is the gate electrode of the reset transistor M3, and the gate electrode 604 is the gate electrode of the amplifier transistor M4. The gate electrode 605 is the gate electrode of the selection transistor M5. In the plan view, the gate electrodes 604 and 605 are adjacent to each other.

The active region 102a below the gate electrode 601 is the photoelectric conversion unit 402 formed of a photodiode. The active region 102a between the gate electrode 601 and the gate electrode 602 is the charge holding unit 403 that temporarily holds charges transferred from the photoelectric conversion unit 402. The first transfer transistor M1 is formed disposed between the photoelectric conversion unit 402 and the charge holding unit 403. The active region 102a between the gate electrode 602 and the gate electrode 603 is the charge-voltage conversion unit 404.

The active region 102a is connected between the photoelectric conversion unit 402 and a connection portion to the power source voltage line (the active region 102a between the gate electrodes 603 and 604), and the gate electrode 606 of the OFD transistor M6 is arranged on this connection portion. The light shielding member 308 is provided over the charge holding unit 403 and the gate electrode 601 and 602. In FIG. 7, the black circles schematically represent contact portions to be connected to the wirings in the upper layer.

Figure 8:
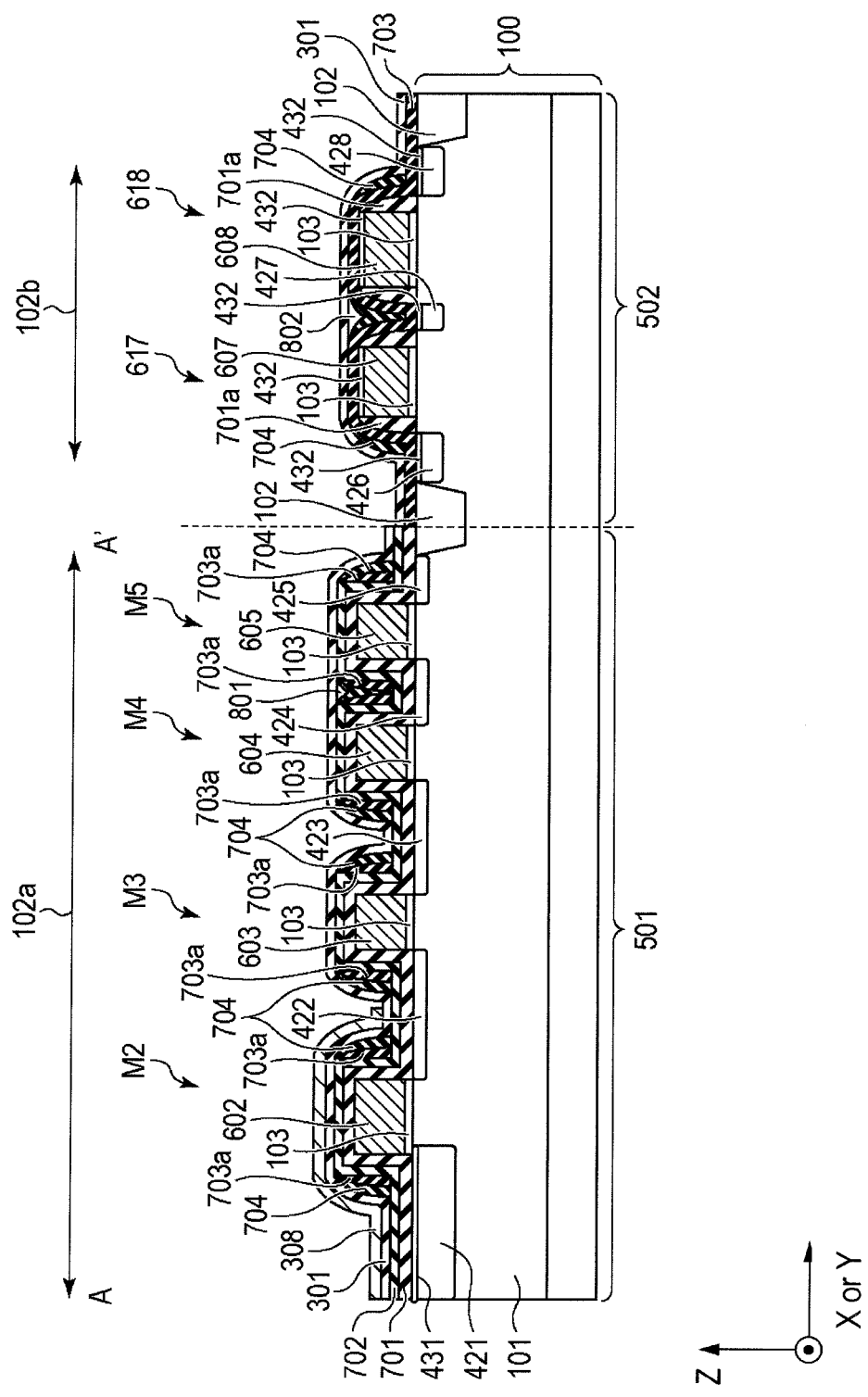
FIG. 8 is a schematic sectional view illustrating the structure of the solid state imaging device according to the third embodiment of the present invention.

FIG. 8 is a schematic sectional view of the pixel region and the peripheral region of the solid state imaging device according to the present embodiment. That is, the pixel region 501 in the left side in FIG. 8 illustrates a cross section along a line A-A' of FIG. 7 from the charge holding unit 403 to the selection transistor M5, and the peripheral region 502 in the right side of the dotted line illustrates a cross section of particular two neighboring transistors provided in the column amplifying circuit or the like. FIG. 8 also illustrates a sectional view parallel to the X-Y plane and a sectional view parallel to the Y-Z plane.

The well 101 formed of a P-type semiconductor region and the element isolation regions 102 are provided inside the semiconductor substrate 100. In the pixel region 501, the active region 102a shaped in substantially a mirrored figure S as depicted in FIG. 7 is defined by the element isolation regions 102. In the peripheral region 502, an active region 102b is defined by the element isolation regions 102.

On the surface portion of the active region 102a of the pixel region 501, an N-type semiconductor region 421 and a P-type semiconductor region 431, an N-type semiconductor region 422, an N-type semiconductor region 423, an N-type semiconductor region 424, and an N-type semiconductor region 425 are provided spaced apart from each other. The N-type semiconductor region 421 is an impurity region forming the charge holding unit 403. The P-type semiconductor region 431 is a surface passivation layer of the N-type semiconductor region 421. The N-type semiconductor region 422 is an impurity region (a floating diffusion region) forming the charge-voltage conversion unit 404. The N-type semiconductor region 423 is an impurity region forming the drains of the reset transistor M3 and the amplifier transistor M4. The N-type semiconductor region 424 is an impurity region forming the source of the amplifier transistor M4 and the drain of the selection transistor M5. The N-type semiconductor region 425 is an impurity region forming the source of the selection transistor M5 and functions as the pixel output unit 407.

The gate electrode 602 is provided via the gate insulating film 103 on the semiconductor substrate 100 between the N-type semiconductor region 421 and the N-type semiconductor region 422. Thereby, formed is the second transfer transistor M2 having source/drain regions formed of the N-type semiconductor regions 421 and 422 and the gate electrode 602. Further, the gate electrode 603 is provided via the gate insulating film 103 on the semiconductor substrate 100 between the N-type semiconductor region 422 and the N-type semiconductor region 423. Thereby, formed is the reset transistor M3 having source/drain regions formed of the N-type semiconductor regions 422 and 423 and the gate electrode 603. Further, the gate electrode 604 is provided via the gate insulating film 103 on the semiconductor substrate 100 between the N-type semiconductor region 423 and the N-type semiconductor region 424. Thereby, formed is the amplifier transistor M4 having source/drain regions formed of the N-type semiconductor regions 423 and 424 and the gate electrode 604. Further, the gate electrode 605 is provided via the gate insulating film 103 on the semiconductor substrate 100 between the N-type semiconductor region 424 and the N-type semiconductor region 425. Thereby, formed is the selection transistor M5 having source/drain regions formed of the N-type semiconductor regions 424 and 425 and the gate electrode 605.

On the surface portion of the active region 102b of the peripheral region 502, the N-type semiconductor regions 426, 427, and 428 are provided spaced apart from each other. A gate electrode 607 is provided via the gate insulating film 103 on the semiconductor substrate 100 between the N-type semiconductor region 426 and the N-type semiconductor region 427. Thereby, formed is a peripheral transistor 617 having source/drain regions formed of the N-type semiconductor regions 426 and 427 and the gate electrode 607. Further, a gate electrode 608 is provided via the gate insulating film 103 on the semiconductor substrate 100 between the N-type semiconductor region 427 and the N-type semiconductor region 428. Thereby, formed is a peripheral transistor 618 having source/drain regions formed of the N-type semiconductor regions 427 and 428 and the gate electrode 608. Metal silicide films 432 for reducing a wiring resistance, a diffusion layer resistance, a contact resistance, and the like are provided on the surface portions of the N-type semiconductor regions 426, 427, and 428 and the gate electrodes 607 and 608 of the peripheral transistors 617 and 618. Cobalt silicide, titanium silicide, or the like can be employed as the metal silicide film 432.

Dielectric films 701 and 702 are provided on the semiconductor substrate 100 of the pixel region 501 so as to cover the upper surfaces and the side surfaces of the gate electrodes 602, 603, 604, and 605. Sidewall spacers 703a and 704 are provided on the side surfaces of the gate electrodes 602, 603, 604, and 605 covered with the dielectric films 701 and 702.

Sidewall spacers 701a are provided on the side surfaces of the pair of gate electrodes 607 and 608 of the peripheral transistors 617 and 618 arranged in the peripheral region 502. Further, a dielectric film 703 is provided on the semiconductor substrate 100 in the peripheral region 502 so as to cover the upper surfaces and the side surfaces of the gate electrodes 607 and 608 whose side surfaces are covered with the sidewall spacers 701a. Sidewall spacers 704 are provided on the side surfaces of the gate electrodes 607 and 608 covered with the sidewall spacers 701a and the dielectric film 703.

The insulator film 301 is provided on the entire surface over the semiconductor substrate 100. A gap between a pair of gate electrodes 604 and 605 is not filled with the insulator film 301, and a void 801 is formed in the gap. That is, the void 801 is present in the region surrounded by the first and second gate electrodes 604 and 605 and the insulator film 301. The light shielding member 308 is not formed in a position in the opposite side of the insulator film 301 to the void 801 in the Z-axis direction perpendicular to the plan view. Further, a gap between a pair of gate electrodes 607 and 608 is not filled with the insulator film 301, and a void 802 is formed in the gap. The light shielding member 308 is provided on the insulator film 301 of the pixel region 501 so as to cover the charge holding unit 403 and the gate electrode 602 of the second transfer transistor M2. Note that, although not depicted in FIG. 8, an interlayer insulating film, contact holes penetrating the interlayer insulating film and the insulator film 301, and wirings connected to the contact holes are provided on the insulator film 301 in a similar manner to FIG. 2.

FIG. 9A to FIG. 11 are process sectional views illustrating a manufacturing method of the solid state imaging device according to the present embodiment. In FIG. 9A, the element isolation regions 102 that define the active regions 102a and 102b are formed on the surface portion of the semiconductor substrate 100 by using the STI technique, the LOCOS technique, or the like, for example. Next, the well 101 made of a P-type semiconductor region is formed on predetermined regions of the pixel region 501 and the peripheral region 502 by an ion implantation technique. The N-type semiconductor region 421 and the P-type semiconductor region 431 are formed by an ion implantation technique in a region of the pixel region 501 where the charge holding unit 403 is formed.

The gate insulating film 103 made of a silicon oxide film or the like is formed on the surface portion of the active regions 102a and 102b of the semiconductor substrate 100 by using a thermal oxidation technique, a CVD technique, or the like, for example. For example, a polysilicon film is deposited by using a CVD technique on the entire surface on the semiconductor substrate 100 on which the gate insulating film 103 has been formed. Next, the polysilicon film is patterned by using a photolithography and a dry etching to form the gate electrodes 602, 603, 604, 605, 607, and 608 made of the polysilicon film. The N-type semiconductor regions 422, 423, 424, and 425 are formed inside the semiconductor substrate 100 in the pixel region 501 in a self-aligning manner with respect to the gate electrodes 602, 603, 604, and 605 by an ion implantation technique.

Note that, although illustrated here is an example in which the N-type semiconductor region 421 and the P-type semiconductor region 431 are formed before the gate electrodes 602 to 608 are formed, the N-type semiconductor region 421 and the P-type semiconductor region 431 may be formed after the gate electrodes 602 to 608 are formed. In this case, it is possible to form the N-type semiconductor region 421 and the P-type semiconductor region 431 in a self-aligning manner with respect to the gate electrode 602 similarly to the N-type semiconductor regions 422, 423, 424, and 425.

Next, the dielectric film 701 such as a silicon oxide film or the like is formed by using a CVD technique or the like on the entire surfaces of the semiconductor substrate 100 on which the gate electrodes 602 to 608 have been formed. The dielectric film 701 may be used as an anti-reflection film with laminated structure of a silicon oxide layer(s) and a silicon nitride layer(s). After a photoresist film (not illustrated) that covers the pixel region 501 and exposes the peripheral region 502 is formed by using a photolithography, the dielectric film 701 of the peripheral region 502 is etched back by using this photoresist film as a mask. Thereby, the dielectric film 701 is left in the pixel region 501, and the sidewall spacers (the first sidewall spacer) 701a made of the dielectric film 701 (the first dielectric film) are formed on the side surfaces of the gate electrodes 607 and 608 of the peripheral region 502. Subsequently, the photoresist film (not illustrated) used for the mask is removed by asking, for example.

Next, in FIG. 9B, an ion implantation is performed in the peripheral region 502 by using the gate electrodes 607 and 608 and the sidewall spacers 701a as a mask. Thereby, the N-type semiconductor regions 426, 427, and 428 that serve as source/drain regions are formed in a self-aligning manner with respect to the gate electrodes 607 and 608 and the sidewall spacers 701a. Subsequently, the dielectric film 702 is deposited on the entire surface by using a CVD technique or the like, for example. This dielectric film 702 is used as a passivation film for the pixel region 501 when the metal silicide film 432 is formed in the peripheral region 502. After the dielectric film 702 is deposited and after a photoresist film (not illustrated) that covers the pixel region 501 and exposes the peripheral region 502 is formed by using a photolithography, the dielectric film 702 of the peripheral region 502 is etched by using this photoresist film as a mask. Thereby, the dielectric film 702 is selectively left in the pixel region 501. Subsequently, the photoresist film (not illustrated) used for the mask is removed by asking, for example.

The metal silicide film 432 is selectively formed by using the SALICIDE (Self-ALIgned siliCIDE) process on the surface portions of the gate electrodes 607 and 608 and the N-type semiconductor region 426 in the peripheral region 502 where silicon is exposed. Specifically, the metal film such as cobalt, for example, is deposited, a thermal treatment is performed, and, after silicon of a portion contacting with this metal film is silicidized, unreacted metal film is removed. Thereby, the metal silicide film 432 is locally formed.

Next, as illustrated in FIG. 10A, the dielectric film (the first dielectric film) 703 is deposited on the entire surface by using a spattering technique, a CVD technique, or the like, for example. After a photoresist film (not illustrated) that covers the peripheral region 502 and exposes the pixel region 501 is formed by using a photolithography, the dielectric film 703 of the pixel region 501 is etched back by using this photoresist film as a mask. Thereby, the dielectric film 703 is left in the peripheral region 502, and the sidewall spacers (the first sidewall spacer) 703a made of the dielectric film 703 are formed on the side surfaces of the gate electrodes 602 to 605 of the pixel region 501 covered with the dielectric films 701 and 702. Subsequently, the photoresist film (not illustrated) used for the mask is removed by asking, for example.

Next, as illustrated in FIG. 10B, after the second dielectric film such as a silicon oxide film is deposited on the entire surface by using a CVD technique or the like, for example, this dielectric film is etched back. Thereby, the sidewall spacers (the second sidewall spacer) 704 are formed on the side surfaces of the gate electrodes 602 to 605 covered with the dielectric films 701 and 702 and the sidewall spacers 703a. Further, the sidewall spacers 704 are formed on the side surfaces of the gate electrodes 607 and 608 covered with the sidewall spacers 701a and the dielectric film 703. In this process, the dielectric films 701 and 703 may be used as an etching stopper film by forming the dielectric films 701 and 703 with a silicon nitride film.

In this process, depending on the thickness of the film covering the side surfaces of the gate electrodes 602 to 608 and the spacing between the gate electrodes 602 to 608, narrow gaps may or may not occur between the sidewall spacers 704. For example, when the thickness of the film covering the side surfaces of the gate electrodes 602 to 608 is 0.2 μm and when the spacing of the gate electrodes 602 to 608 is narrower than 0.3 μm, narrow gaps occurs between the sidewall spacers 704. For example, such narrow gaps may occur at a location between a pair of neighboring gate electrodes where no contact part is required to be provided in the impurity regions between these gate electrodes. For example, in FIG. 10B, narrow gaps occur between the first gate electrode 604 and the second gate electrode 605 and between the first gate electrode 607 and the second gate electrode 608. If one tried to deposit the light shielding member 308 directly in the narrow gap and remove it by an etching, there would be a likelihood of occurrence of a residue of the light shielding member 308 as described above. As describe later, according to the present embodiment, occurrence of an etching residue can be prevented by forming a void in a narrow gap. Note that no contact part is provided in the impurity region between the first gate electrode 604 and the second gate electrode 605, as illustrated in FIG. 6. On the other hand, such a narrow gap does not occur in a position where the spacing between the gate electrodes 602 to 608 is greater than 0.4 µm.

Figure 11:
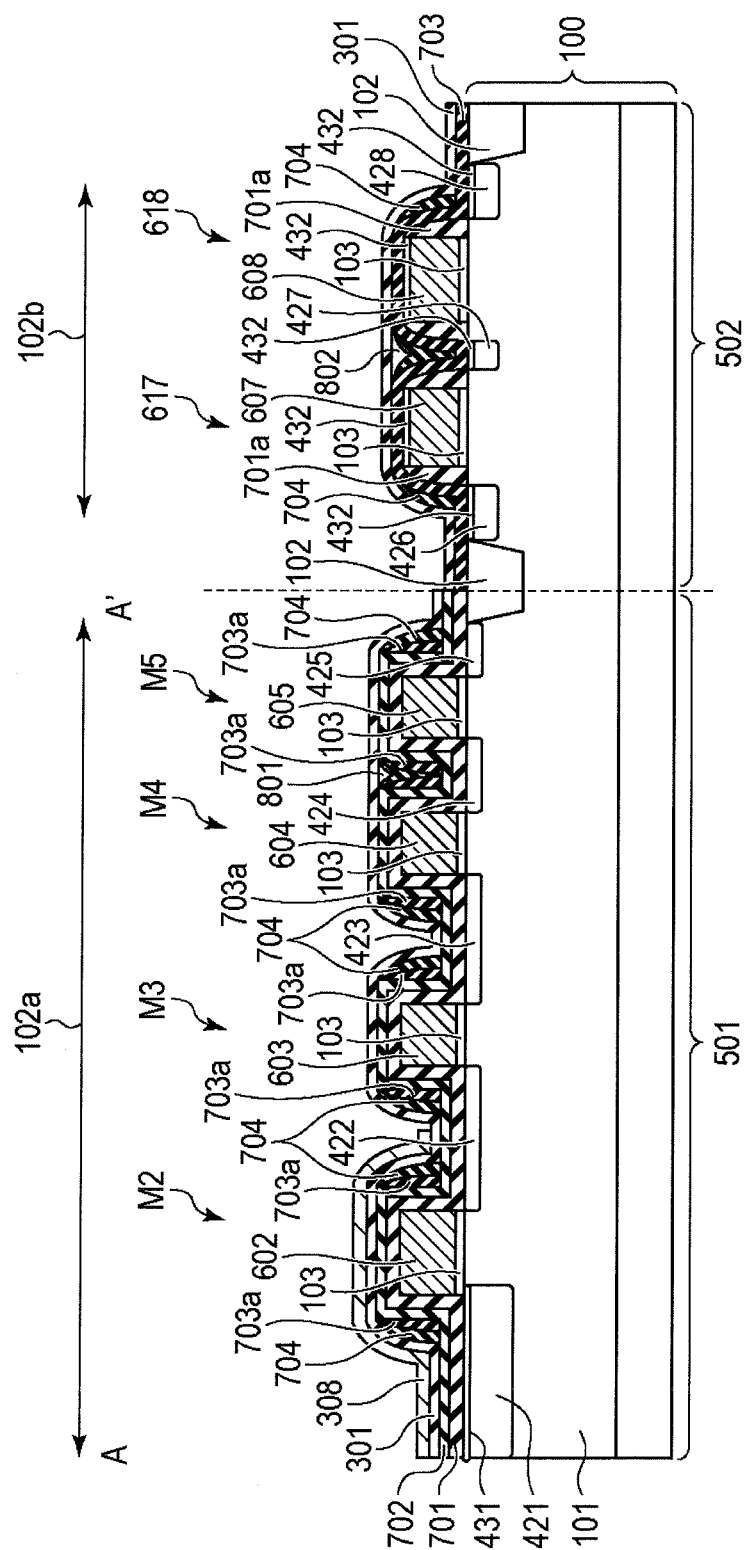
FIG. 11 is a process sectional view illustrating a manufacturing method of the solid state imaging device according to the third embodiment of the present invention.

Next, as illustrated in FIG. 11, the insulator film 301 such as a silicon oxide film is deposited by using a plasma CVD technique or the like, for example. In this process, the voids 801 and 802 are formed in a gap between the first gate electrode 604 and the second gate electrode 605 and a gap between the first gate electrode 607 and the second gate electrode 608 so that the insulator film 301 is not filled therein. Recesses over the regions between the gate electrodes 604 and 605 and between the gate electrodes 607 and 608 are reduced by forming the insulator film 301 so as to leave the voids 801 and 802.

As a specific deposition condition, it is preferable to perform deposition by using a CVD technique with small anisotropy and/or fluidity such as a parallel plate plasma CVD technique in which a TEOS-$O_2$ based gas type and/or a $SiH_4$—$O_2$ based gas type is used. This is because, while the void 801 that is an air gap is likely to be formed among the gate electrode 604, the gate electrode 605, and the insulator film 301 due to a faster deposition rate, a gap sufficiently narrower than the void 801 is closed and thus a recess on a film over the void can be reduced.

In the present embodiment, the gas flow rates were TEOS: 265 sccm and $O_2$: 2.5 sccm, and the pressure was 360 Pa. Further, the RF outputs were 720 W at an upper electrode and 320 W at a lower electrode, the deposition time was 4 seconds, and a plasma CVD oxide film around 500 angstroms was deposited.

Next, the light shielding member 308 made of tungsten, tungsten silicide, or the like is formed on the insulator film 301 by using a sputtering technique, a CVD technique, or the like. Furthermore, the light shielding member 308 is patterned into a predetermined shape by using a photolithography and a dry etching.

The light shielding member 308 over the charge holding unit 403, the gate electrode 601 of a transfer transistor, and the gate electrode 602 of a second transfer transistor 612 remains by the patterning, and other portions are removed by an etching. In this process, the flatness of the surface of the insulator film 301 over a region between the gate electrodes 604 and 605 and a region between the gate electrodes 607 and 608 is improved in a similar manner to the first and second embodiments, which can prevent an etching residue of the light shielding member 308 from occurring in this portion.

Further, a level difference of the gate electrode 602 can be reduced by laminating the sidewall spacers 703a and 704 on the side surfaces of the gate electrode 602. This improves the covering property of the light shielding member 308 and improves the light shielding property. Furthermore, the void 801 is formed between the first gate electrode 604 of the amplifier transistor M4 and the second gate electrode 605 of the selection transistor M5. The void 801 that is an air gap has a lower dielectric constant than that of the dielectric films 703 and 704 made of silicon oxide, silicon nitride, or the like. Therefore, the parasitic capacity between the gate electrodes 604 and 605 can be reduced compared to the case where the dielectric films 703 and 704 are filled between the gate electrodes 604 and 605. The reduced parasitic capacity of the gate electrode 604 of the amplifier transistor M4 can suppress a reduction of the amplifying efficiency of the amplifier circuit.

In a similar manner to the first and second embodiments, the insulator film 301 also functions as an etching stopper film in an etching of the light shielding member. In the Z-axis direction (the first direction), the film thickness of the insulator film 301 is denoted as t, the film thickness of the light shielding member 308 is denoted as $d_1$, the ratio of over-etching time to main etching time at an etching of the light shielding member is denoted as a, and the selection ratio of the insulator film 301 to the light shielding member 308 at the etching of the light shielding member is denoted as b. In this case, the thickness of the insulator film etched at the etching of the light shielding member is $a \times b \times d_1$.

When the film thickness t of the insulator film 301 is less than $a \times b \times d_1$, the surface of the dielectric film 703 is exposed at an etching of the light shielding member in the pixel region. When the dielectric film 703 is used as an anti-reflection film for a photodiode, a change in the film thickness due to the etched dielectric film 703 is likely to cause a change in the optical characteristics of the photodiode. Therefore, the film thickness t of the insulator film 301 is preferably greater than or equal to $a \times b \times d_1$.

When the dielectric film 703 is not used as an anti-reflection film for a photodiode, a sum of the film thickness t of the insulator film 301 and the film thickness t' of the dielectric film 703 is preferably less than $a \times b \times d_1$.

Since contacting of the light shielding member 308 with a wiring causes a leakage or the like, it is preferable that the film thickness t of the insulator film 301 is such a film thickness that the light shielding member and a wiring do not contact with each other. When the film thickness of the gate electrodes 607 and 608 in the pixel region are different, it is preferable that the film thickness t of the insulator film 301 is less than $d_3-(d_1+d_2+d_4)$, where $d_2$ represents a sum of a larger film thickness of a gate electrode and the film thickness of the dielectric film 703, $d_3$ represents the least distance of the distances to the semiconductor substrate 100 and to a wiring (the film thickness of the interlayer insulating film), and $d_4$ represents the thickness of the gate insulating film 103.

In terms of the light shielding property, since a larger film thickness of the insulator film 301 results in a longer distance between the light shielding member 308 and the semiconductor substrate 100 resulting in a reduced light shielding property, the film thickness of the insulator film 301 is preferably as small as possible.

A specific example will be described below. When tungsten is used for the light shielding member 308, the film thickness $d_1$ is preferably greater than or equal to 0.1 µm to obtain a sufficient light shielding capability. The transmittance of tungsten is 0.2% or less at a thickness of 0.1 µm or greater, and thus a sufficient light shielding capability is realized.

When the ratio a of over-etching time to main etching time at an etching of the light shielding member is 0.1 and the selection ratio b of the insulator film 301 to the light shielding member 308 at the etching of the light shielding member is 0.1, the film thickness t of the insulator film 301 is required to be at least 1 nm or greater. Since it is necessary to take manufacturing variation into consideration in the actual practice, the film thickness of the insulator film 301 is preferably greater than or equal to 5 nm.

Further, when the film thickness $d_2$ of the gate electrodes is 0.2 μm, the film thickness $d_3$ of the interlayer insulating film is 0.6 μm, and the thickness of the gate insulating film 103 is 8.0 nm, the film thickness t of the insulator film 301 is preferably less than at least 0.3 μm to avoid contacting with the wirings. In practice, since it is necessary to take into consideration of manufacturing variation of the interlayer insulating film thickness and/or the film thickness of the light shielding member 308, and a reduction in the light shielding property due to the increased film thickness t of the insulator film 301, the film thickness t of the actual insulator film 301 is preferably less than 0.1 μm.

Therefore, the film thickness of the insulator film 301 is preferably greater than or equal to 1 nm and less than 0.3 μm, and more preferably greater than 5 nm and less than 0.1 μm.

As described above, the present embodiment can reduce a recess on a surface of an insulator film formed between gate electrodes and improve the flatness of an underlying layer of a structure formed on such a region. In particular, in the case where a conductive film formed over a region between gate electrodes is removed by an etching, such removal can suppress a residue of the conductive film on a recess of an insulator film and thus improve a yield ratio. Furthermore, the light shielding property can be improved by forming a sidewall spacer on a side surface of a gate electrode.

Although the case where a spacing between gate electrodes is narrower than 0.3 μm has been exemplified in the present embodiment as a condition where a narrow gap occurs between sidewall spacers, a spacing between gate electrodes in which a narrow gap occurs is not necessarily limited to the case where the spacing is narrower than 0.3 μm. A change in the film thickness of the insulator film deposited on the side surfaces of gate electrodes and/or in the width of the sidewall spacers may cause a change in the width of a gap between the sidewall spacers accordingly. Therefore, it is preferable that a position where an insulator film is formed so as to leave a void is properly set depending on a design rule, a process condition, or the like required to each solid state imaging device with taking into consideration of a size of a recess formed on the insulator film.

Further, in the present embodiment, the gate electrodes 601 to 605 of the pixel region 501 are covered with the dielectric films 701 and 702, the sidewall spacers 703*a* and 704, and the insulator film 301. However, the configuration of the insulator film and the dielectric films covering the gate electrodes 601 to 605 is not limited the above. For example, the number of laminated sidewall spacers may be properly increased or decreased in accordance with the degree in the reduction of a level difference by the sidewall spacers 703*a* and 704. Alternatively, any one of the dielectric films 701 and 702 may not be formed. The same applies to the peripheral region 502.

Furthermore, although the example in which a void is formed between the gate electrodes of the amplifier transistor M4 and the selection transistor M5 in the pixel region 501 has been illustrated in the present embodiment, a void may be formed between gate electrodes of other transistors M1 to M4 and M6.

Fourth Embodiment

Figure 12:
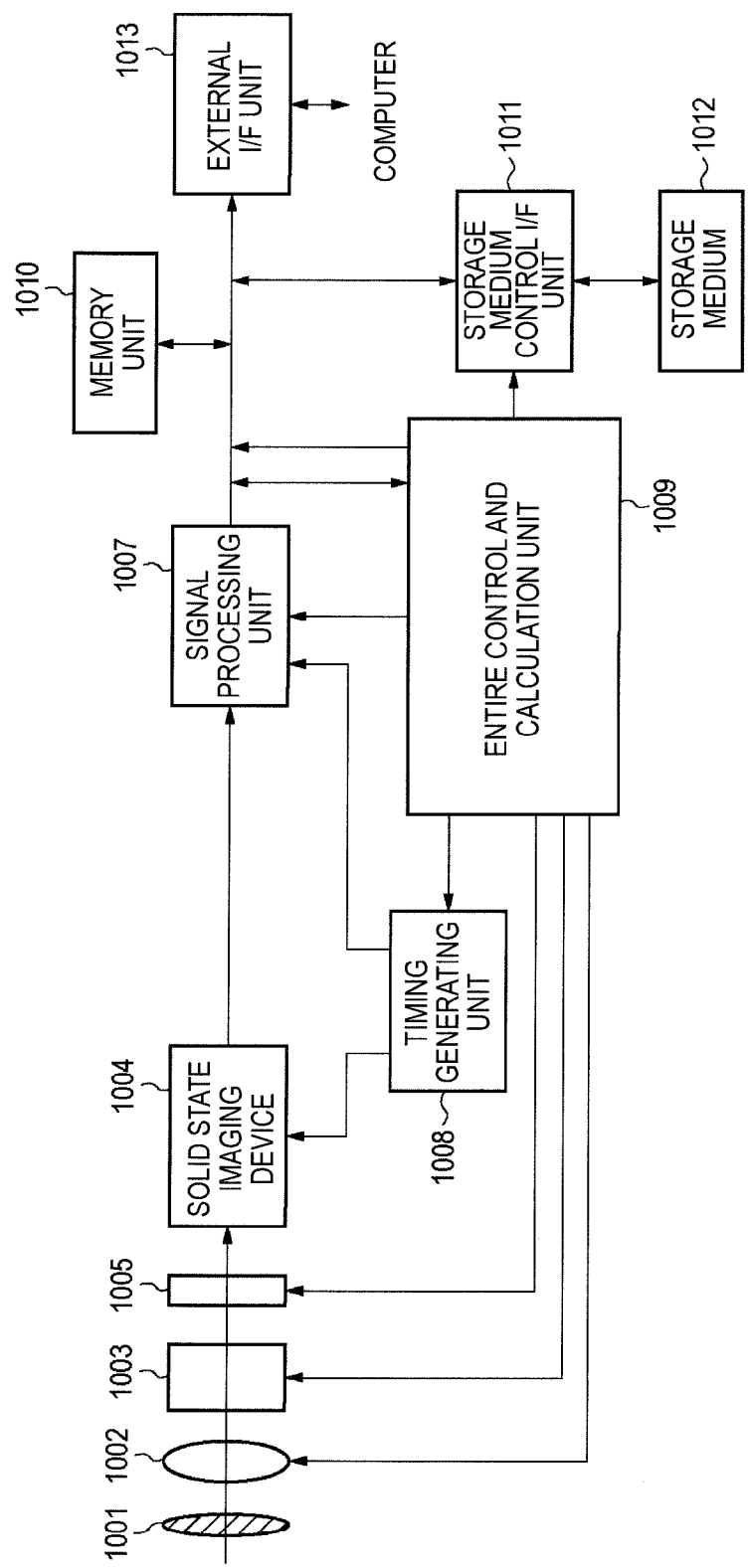
FIG. 12 is a block diagram of an imaging system according to a fourth embodiment of the present invention.

An imaging system according to the fourth embodiment of the present invention will be described. An imaging system may be a digital still camera, a digital camcorder, a copying machine, a facsimile machine, a mobile phone, an on-vehicle camera, an observation satellite, and so on. FIG. 12 illustrates a block diagram of a digital still camera as an example of the imaging system according to the fourth embodiment.

In FIG. 12, the imaging system includes a barrier 1001 for protection of a lens, a lens 1002 that causes an optical image of an object to be captured on a solid state imaging device 1004, an aperture 1003 for changing a light amount that has passed through the lens 1002, and a mechanical shutter 1005. The imaging system further includes the solid state imaging device 1004 described in the first to third embodiments above, and the solid state imaging device 1004 converts an optical image captured by the lens 1002 into image data. In addition, an A/D converter is formed on the semiconductor substrate of the solid state imaging device 1004. The imaging system further includes a signal processing unit 1007, a timing generating unit 1008, an entire control and calculation unit 1009, a memory unit 1010, a storage medium control I/F unit 1011, a storage medium 1012, and an external I/F unit 1013. The signal processing unit 1007 compresses various correction and/or data to image data that is output from the solid state imaging device 1004. The timing generating unit 1008 outputs various timing signals to the solid state imaging device 1004 and the signal processing unit 1007. The entire control and calculation unit 1009 controls the entire digital still camera, and the memory unit 1010 functions as a frame memory for temporarily storing image data. The storage medium control I/F unit 1011 performs storage or reading with a storage medium. The storage medium 1012 is formed of a removable semiconductor memory or the like and performs storage or reading of image data. The external I/F unit 1013 is an interface for communicating with an external computer or the like. In this system, a timing signal or the like may be input from the outside of the imaging system, and the imaging system is realized by having at least the solid state imaging device 1004 and the signal processing unit 1007 that processes image signals output from the solid state imaging device 1004.

Other Embodiments

The embodiments described above are intended to illustrate specific examples for implementing the present invention, and the technical scope of the present invention is not intended to be construed in a limiting manner by these embodiments. That is, the present invention can be implemented in various forms without departing from its technical concept. For example, the present invention is widely applicable not only to an air gap between gate electrodes of transistors but also to circuit arrangements such as a fine space between wirings where an etching residue of a light shielding member would otherwise occur. Further, although solid state imaging devices whose signal charges are electrons have been exemplified in the embodiments described above, the present invention can be applied in a similar manner to a solid state imaging device whose signal charges are holes. Note that, in this case, the semiconductor regions described above will have the opposite P-type and N-type. Further, the planer layout of the pixel circuit of the solid state imaging device illustrated in FIG. 6 is one example, and a planer layout of a pixel circuit of a solid state imaging device to which the present invention may be applied is not limited thereto. Furthermore, a configuration of a reading out unit of the pixel circuit is not limited to the example illustrated in FIG. 6.

Further, although the present invention has been described in the third embodiment by exemplifying a CMOS image sensor having the global electronic shutter function, a solid state imaging device to which the present invention may be applied is not limited to a CMOS image sensor. For example, the present invention is also applicable to a CCD image sensor. In a CCD image sensor, a light shielding member is arranged on a reading out unit for reading and transferring charges generated by a photoelectric conversion in a photoelectric conversion unit. The same structure and manufacturing method as those in the embodiments described above can be applied to a ground structure on which this light shielding member is deposited and a manufacturing method thereof. Note that, in the present specification, "charge holding unit" also means the reading out unit described above in the case where the solid state imaging device is a CCD image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-101704, filed May 19, 2015, and Japanese Patent Application No. 2016-081833, filed Apr. 15, 2016, which are hereby incorporated by reference herein in their entirety.

What is claimed is:

1. A solid state imaging device comprising:
   a pixel circuit comprising:
   a photoelectric conversion unit provided in a substrate;
   a first transistor having a first gate electrode over the substrate;
   a second transistor having a second gate electrode adjacent to the first gate electrode in a plan view, the second gate electrode being over the substrate;
   an insulator film covering the first gate electrode and the second gate electrode;
   a light shielding member provided on the insulator film;
   an interlayer insulating film over the light shielding member; and
   a wiring over the interlayer insulating film,
   wherein a void is present in a region surrounded by the first gate electrode, the second gate electrode, and the insulator film,
   wherein the interlayer insulating film is provided between the first and second gate electrodes and the wiring,
   wherein the light shielding member is provided between the insulator film and the interlayer insulating film, and
   wherein the light shielding member is absent in a position on an opposite side of the insulator film to the void in a direction perpendicular to the plan view.

2. The solid state imaging device according to claim 1, further comprising sidewall spacers provided on side surfaces of the first gate electrode and the second gate electrode,
   wherein the void is present in a region surrounded by the insulator film and the sidewall spacers.

3. The solid state imaging device according to claim 1, wherein the insulator film satisfies:

$$a \times b \times d_1 \leq t,$$

where a represents a ratio of etching time of the insulator film to etching time of a film that becomes the light shielding member, b represents an etching selection ratio of the insulator film to the film that becomes the light shielding member, t represents a film thickness in a direction perpendicular to the plan view of the insulator film, and $d_1$ represents a film thickness in the direction perpendicular to the plan view of the light shielding member.

4. The solid state imaging device according to claim 1, wherein a film thickness t of the insulator film satisfies:

$$t < d_3 - (d_1 + d_2),$$

where, in a direction perpendicular to the plan view, t represents a film thickness of the insulator film, $d_1$ represents a film thickness of the light shielding member, $d_2$ represents a film thickness of the first gate electrode, and $d_3$ represents a least distance of distances between the wiring and the substrate.

5. The solid state imaging device according to claim 1, wherein the pixel circuit includes a charge-voltage conversion unit to which charges from the photoelectric conversion unit are transferred, and
   wherein the first gate electrode is connected to the charge-voltage conversion unit.

6. The solid state imaging device according to claim 1, wherein one terminal of the second transistor is an output unit of the pixel circuit.

7. The solid state imaging device according to claim 1, wherein the first transistor and the second transistor share an impurity region, and
   wherein the void is present over the impurity region.

8. The solid state imaging device according to claim 5, wherein the pixel circuit includes:
   a third transfer transistor that transfers charges of the photoelectric conversion unit to a charge holding unit; and
   a fourth transfer transistor that transfers charges of the charge holding unit to the charge-voltage conversion unit, and
   wherein the light shielding member covers the charge holding unit while the light shielding member does not cover the void.

9. The solid state imaging device according to claim 1, wherein a film thickness of the insulator film in a direction perpendicular to the plan view is 1 nm to less than 0.3 µm.

10. An imaging system comprising:
    a solid state imaging device comprising:
    a pixel circuit comprising:
    a photoelectric conversion unit provided in a substrate;
    a first transistor having a first gate electrode over the substrate;
    a second transistor having a second gate electrode adjacent to the first gate electrode, the second gate electrode being over the substrate;
    an insulator film covering the first gate electrode and the second gate electrode;
    a light shielding member provided on the insulator film;
    an interlayer insulating film over the light shielding member; and
    a wiring over the interlayer insulating film,
    wherein a void is present in a region surrounded by the first gate electrode, the second gate electrode, and the insulator film,
    wherein the light shielding member is absent in a position on an opposite side of the insulator film to the void, wherein the interlayer insulating film is provided between the first and second gate electrodes and the wiring, wherein the light shielding member is provided between the insulator film and the interlayer insulating film; and a signal processing unit that processes a signal output by the solid state imaging device.

11. The solid state imaging device according to claim 1, wherein the first transistor is configured to control transferring changes from the photoelectric conversion unit to a charge holding unit, and wherein the second transistor is an overflow drain transistor.

12. A solid state imaging device comprising:

a photoelectric conversion unit provided in a substrate;

a first transistor having a first gate electrode over the substrate;

a second transistor having a second gate electrode adjacent to the first gate electrode in a plan view, the second gate electrode being over the substrate;

an insulator film covering the first gate electrode and the second gate electrode;

a light shielding member provided on the insulator film;

an interlayer insulating film over the light shielding member; and a wiring over the interlayer insulating film, wherein a void is present in a region surrounded by the first gate electrode, the second gate electrode, and the insulator film, wherein the interlayer insulating film is provided between the first and second gate electrodes and the wiring, wherein the light shielding member is provided between the insulator film and the interlayer insulating film, and wherein the light shielding member is absent in a position on an opposite side of the insulator film to the void in a direction perpendicular to the plan view.

13. The solid state imaging device according to claim 12, further comprising sidewall spacers provided on side surfaces of the first gate electrode and the second gate electrode, wherein the void is present in a region surrounded by the insulator film and the sidewall spacers.

14. The solid state imaging device according to claim 12, comprising a pixel region comprising the photoelectric conversion unit, wherein the first gate electrode is connected to a charge-voltage conversion unit, and wherein one terminal of the second transistor is an output unit of a pixel circuit.

15. The solid state imaging device according to claim 12, wherein the first transistor is configured to control transferring charges from the photoelectric conversion unit to a charge holding unit, and wherein the second transistor is an overflow drain transistor.

16. The solid state imaging device according to claim 12, further comprising:

a pixel region comprising the photoelectric conversion unit; and a peripheral region comprising one of a vertical scanning circuit, a column amplifying circuit, a horizontal scanning circuit, and an output unit, wherein one of the vertical scanning circuit, the column amplifying circuit, the horizontal scanning circuit, and the output unit includes the first transistor and the second transistor.

17. The solid state imaging device according to claim 12, wherein the first transistor and the second transistor share an impurity region, and wherein the void is present over the impurity region.

18. The solid state imaging device according to claim 12, further comprising:

a third transfer transistor that transfers charges of the photoelectric conversion unit to a charge holding unit; and a fourth transfer transistor that transfers charges of the charge holding unit to a charge-voltage conversion unit, and wherein the light shielding member covers the charge holding unit while the light shielding member does not cover the void.

19. The solid state imaging device according to claim 12, wherein a thickness of the insulator film in a direction perpendicular to the plan view is 1 nm to less than 0.3 μm.

* * * * *